US008520291B2

(12) United States Patent
Tanaka

(10) Patent No.: US 8,520,291 B2
(45) Date of Patent: Aug. 27, 2013

(54) ILLUMINATION OPTICAL SYSTEM, EXPOSURE APPARATUS, AND DEVICE MANUFACTURING METHOD

(75) Inventor: Hirohisa Tanaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 80 days.

(21) Appl. No.: 12/252,274

(22) Filed: Oct. 15, 2008

(65) Prior Publication Data

US 2009/0097094 A1 Apr. 16, 2009

Related U.S. Application Data

(60) Provisional application No. 60/960,947, filed on Oct. 22, 2007, provisional application No. 61/129,614, filed on Jul. 8, 2008.

(30) Foreign Application Priority Data

Oct. 16, 2007 (JP) ................................ 2007-269188
Jul. 2, 2008 (JP) ................................ 2008-173244

(51) Int. Cl.
*G02B 26/00* (2006.01)
*G02F 1/29* (2006.01)

(52) U.S. Cl.
USPC ............ 359/296; 359/237; 359/298; 359/318

(58) Field of Classification Search
USPC ................. 359/296, 290–292, 295, 223–225, 359/243, 260–263, 298, 198, 301–303, 317–318, 359/237, 242
See application file for complete search history.

(56) References Cited

U.S. PATENT DOCUMENTS 4,346,164 A 8/1982 Tabarelli et al.
5,153,428 A 10/1992 Ellis
5,216,541 A * 6/1993 Takesue et al. ............... 359/561
5,229,872 A 7/1993 Mumola
5,251,222 A 10/1993 Hester et al.
5,312,513 A 5/1994 Florence et al.

(Continued)

FOREIGN PATENT DOCUMENTS

CN 1601322 A 3/2004
CN 1501175 A 6/2004

(Continued)

OTHER PUBLICATIONS

International Search Report for PCT/JP2008/066933 (mailed Jan. 13, 2009).

(Continued)

*Primary Examiner* — Dawayne A Pinkney
(74) *Attorney, Agent, or Firm* — Oliff & Berridge, PLC

(57) ABSTRACT

An illumination optical system which illuminates an irradiated plane with illumination light provided from a light source includes a spatial light modulator which is arranged in an optical path of the illumination optical system and cooperates with part of the illumination optical system to form a desired light intensity distribution at a pupil position of the illumination optical system or a position optically conjugated with the pupil position. A detection unit detects the light intensity distribution of the illumination light at a position in an optical path extending from the light source to the spatial light modulator. The detection unit includes a light receiving surface which receives some of the illumination light. A control unit controls the spatial light modulator based on the light intensity distribution detected by the detection unit.

59 Claims, 8 Drawing Sheets

(56) References Cited

U.S. PATENT DOCUMENTS

| | | | |
|---|---|---|---|
| 5,383,000 | A | 1/1995 | Michaloski et al. |
| 5,461,410 | A | 10/1995 | Venkateswar et al. |
| 5,850,300 | A | 12/1998 | Kathman et al. |
| 5,850,310 | A | 12/1998 | Schweizer |
| 5,991,009 | A | 11/1999 | Nishi et al. |
| 6,406,148 | B1 | 6/2002 | Marshall et al. |
| 6,466,304 | B1 | 10/2002 | Smith |
| 6,577,379 | B1 | 6/2003 | Boettiger et al. |
| 6,577,429 | B1 | 6/2003 | Kurtz et al. |
| 6,665,119 | B1 | 12/2003 | Kurtz et al. |
| 6,737,662 | B2 | 5/2004 | Mulder et al. |
| 6,819,490 | B2 | 11/2004 | Sandstrom et al. |
| 6,829,090 | B2 | 12/2004 | Katsumata et al. |
| 6,844,927 | B2 | 1/2005 | Stokowski et al. |
| 6,885,493 | B2 | 4/2005 | Ljungblad et al. |
| 6,891,655 | B2 | 5/2005 | Grebinski et al. |
| 6,900,915 | B2 | 5/2005 | Nanjyo et al. |
| 6,913,373 | B2 | 7/2005 | Tanaka et al. |
| 6,958,806 | B2 | 10/2005 | Mulder et al. |
| 6,958,867 | B2 | 10/2005 | Ohmori et al. |
| 6,960,035 | B2 | 11/2005 | Okazaki et al. |
| 6,961,116 | B2 | 11/2005 | Den Boef et al. |
| 6,977,718 | B1 | 12/2005 | LaFontaine |
| 7,015,491 | B2 | 3/2006 | Eurlings et al. |
| 7,030,962 | B2 | 4/2006 | Iizuka et al. |
| 7,095,481 | B2 | 8/2006 | Morohoshi |
| 7,095,546 | B2 | 8/2006 | Mala et al. |
| 7,095,921 | B2 | 8/2006 | Okazaki et al. |
| 7,116,403 | B2 | 10/2006 | Troost et al. |
| 7,121,740 | B2 | 10/2006 | Okazaki et al. |
| 7,130,021 | B2 | 10/2006 | Kobayashi |
| 7,130,120 | B2 | 10/2006 | Katsumata et al. |
| 7,148,952 | B2 | 12/2006 | Eurlings et al. |
| 7,177,012 | B2 | 2/2007 | Bleeker et al. |
| 7,193,684 | B2 | 3/2007 | Iizuka et al. |
| 7,259,827 | B2 | 8/2007 | Dierichs |
| 7,289,276 | B2 | 10/2007 | Ohmori et al. |
| 7,400,382 | B2 | 7/2008 | Baba-Ali et al. |
| 7,423,731 | B2 | 9/2008 | Tanitsu et al. |
| 7,508,492 | B2 | 3/2009 | Sekigawa et al. |
| 7,525,642 | B2 | 4/2009 | Mulder et al. |
| 7,532,378 | B2 | 5/2009 | Tanaka et al. |
| 7,542,129 | B2 | 6/2009 | Sandstrom |
| 7,551,261 | B2 | 6/2009 | Fiolka |
| 7,573,564 | B2 | 8/2009 | Ruff et al. |
| 7,605,386 | B2 | 10/2009 | Singer et al. |
| 7,701,555 | B2 | 4/2010 | Arai |
| 7,714,983 | B2 | 5/2010 | Koehler et al. |
| 7,965,380 | B2 | 6/2011 | Bleeker et al. |
| 8,018,589 | B2 * | 9/2011 | MacKinnon et al. ......... 356/300 |
| 2003/0038225 | A1 | 2/2003 | Mulder et al. |
| 2003/0071204 | A1 | 4/2003 | Sandstrom et al. |
| 2003/0098959 | A1 * | 5/2003 | Hagiwara et al. ............... 355/69 |
| 2003/0099026 | A1 | 5/2003 | Sandstrom |
| 2003/0214571 | A1 | 11/2003 | Ishikawa et al. |
| 2004/0053148 | A1 | 3/2004 | Morohoshi |
| 2004/0057034 | A1 | 3/2004 | Zinn et al. |
| 2004/0100629 | A1 | 5/2004 | Stokowski |
| 2004/0108467 | A1 | 6/2004 | Eurlings et al. |
| 2004/0130775 | A1 | 7/2004 | Grebinski |
| 2004/0160582 | A1 | 8/2004 | Lof et al. |
| 2004/0207386 | A1 | 10/2004 | Durr |
| 2004/0257680 | A1 | 12/2004 | Ogawa |
| 2005/0024612 | A1 | 2/2005 | Hirukawa et al. |
| 2005/0094122 | A1 | 5/2005 | Hagiwara et al. |
| 2005/0095749 | A1 | 5/2005 | Krellmann et al. |
| 2005/0141583 | A1 | 6/2005 | Sandstrom |
| 2005/0146702 | A1 | 7/2005 | Eurlings et al. |
| 2005/0168790 | A1 | 8/2005 | Latypov et al. |
| 2005/0213068 | A1 | 9/2005 | Ishii et al. |
| 2005/0219532 | A1 | 10/2005 | Mason |
| 2005/0231703 | A1 | 10/2005 | Kobayashi |
| 2005/0270515 | A1 | 12/2005 | Troost et al. |
| 2005/0281516 | A1 | 12/2005 | Okazaki et al. |
| 2006/0012770 | A1 | 1/2006 | Dierichs |
| 2006/0050261 | A1 | 3/2006 | Brotsack |
| 2006/0055834 | A1 | 3/2006 | Tanitsu et al. |
| 2006/0114446 | A1 | 6/2006 | Gui |
| 2006/0138349 | A1 | 6/2006 | Bleeker et al. |
| 2006/0170901 | A1 | 8/2006 | Tanitsu et al. |
| 2006/0175556 | A1 | 8/2006 | Yabuki |
| 2006/0176452 | A1 | 8/2006 | Kim et al. |
| 2006/0203214 | A1 | 9/2006 | Shiraishi |
| 2006/0232841 | A1 * | 10/2006 | Toishi et al. .................... 359/24 |
| 2006/0245033 | A1 | 11/2006 | Baba-Ali et al. |
| 2007/0013888 | A1 | 1/2007 | Flagello et al. |
| 2007/0146676 | A1 * | 6/2007 | Tanitsu et al. ................... 355/71 |
| 2007/0165202 | A1 | 7/2007 | Koehler et al. |
| 2007/0195305 | A1 | 8/2007 | Mulder et al. |
| 2007/0201338 | A1 * | 8/2007 | Yaoita et al. .................. 369/103 |
| 2007/0273852 | A1 | 11/2007 | Arai |
| 2007/0273853 | A1 | 11/2007 | Bleeker et al. |
| 2007/0296936 | A1 | 12/2007 | Kato et al. |
| 2008/0021948 | A1 | 1/2008 | Wilson et al. |
| 2008/0030707 | A1 | 2/2008 | Tanaka et al. |
| 2008/0074631 | A1 | 3/2008 | Kita |
| 2008/0074746 | A1 | 3/2008 | Cumme |
| 2008/0079930 | A1 | 4/2008 | Klarenbeek |
| 2008/0239268 | A1 | 10/2008 | Mulder et al. |
| 2008/0259304 | A1 | 10/2008 | Dierichs et al. |
| 2009/0021656 | A1 | 1/2009 | Ozaki |
| 2009/0033902 | A1 | 2/2009 | Mulder et al. |
| 2009/0073411 | A1 | 3/2009 | Tanitsu |
| 2009/0091730 | A1 | 4/2009 | Tanaka |
| 2009/0097007 | A1 | 4/2009 | Tanaka |
| 2009/0097094 | A1 | 4/2009 | Tanaka |
| 2009/0109417 | A1 | 4/2009 | Tanitsu |
| 2009/0128886 | A1 | 5/2009 | Hirota |
| 2009/0174877 | A1 | 7/2009 | Mulder et al. |
| 2009/0185154 | A1 | 7/2009 | Tanitsu |
| 2010/0195077 | A1 | 8/2010 | Koehler et al. |
| 2012/0202157 | A1 | 8/2012 | Tanitsu |
| 2012/0236284 | A1 | 9/2012 | Tanaka |

FOREIGN PATENT DOCUMENTS

| | | | |
|---|---|---|---|
| CN | 1573571 | A | 2/2005 |
| CN | 1879062 | A | 12/2006 |
| DE | 206 607 | | 2/1984 |
| DE | 221 563 | A1 | 4/1985 |
| DE | 224 448 | A1 | 7/1985 |
| DE | 242 880 | A1 | 2/1987 |
| DE | 196 35 792 | A1 | 4/1997 |
| DE | 100 29 938 | A1 | 7/2001 |
| DE | 1034333 | A1 | 4/2005 |
| EP | 0 023 231 | A1 | 2/1981 |
| EP | 0 208 552 | A2 | 1/1987 |
| EP | 0 656 555 | A1 | 6/1995 |
| EP | 0 764 858 | A2 | 3/1997 |
| EP | 0 779 530 | | 6/1997 |
| EP | 1 109 067 | | 6/2001 |
| EP | 1 211 561 | A2 | 6/2002 |
| EP | 1 262 836 | A1 | 12/2002 |
| EP | 1 280 007 | A2 | 1/2003 |
| EP | 1 395 049 | A1 | 3/2004 |
| EP | 1 489 462 | A2 | 12/2004 |
| EP | 1 647 864 | A | 4/2006 |
| EP | 1 674 935 | A2 | 6/2006 |
| EP | 1 715 380 | A | 10/2006 |
| EP | 1 798 758 | | 6/2007 |
| EP | 1 843 204 | | 10/2007 |
| EP | 1 882 895 | A1 | 1/2008 |
| EP | 1 970 943 | | 9/2008 |
| EP | 1 993 120 | A1 | 11/2008 |
| FR | 2 474 708 | | 7/1981 |
| JP | A-44-4993 | | 2/1969 |
| JP | A-56-6666 | | 1/1981 |
| JP | A-57-117238 | | 7/1982 |
| JP | A-57-152129 | | 9/1982 |
| JP | A-57-153433 | | 9/1982 |
| JP | A-58-49932 | | 3/1983 |
| JP | U-58-45502 | | 3/1983 |
| JP | A-58-115945 | | 7/1983 |
| JP | A-58-202448 | | 11/1983 |
| JP | A-59-19912 | | 2/1984 |

| | | |
|---|---|---|
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |

| | | |
|---|---|---|
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A 05-013292 | 1/1993 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | A-6-29204 | 2/1994 |
| JP | A-6-42918 | 2/1994 |
| JP | A-6-53120 | 2/1994 |
| JP | A-6-97269 | 4/1994 |
| JP | A-6-104167 | 4/1994 |
| JP | A-6-120110 | 4/1994 |
| JP | B2-6-29102 | 4/1994 |
| JP | 06-124873 | 5/1994 |
| JP | A-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-6-204121 | 7/1994 |
| JP | A-6-229741 | 8/1994 |
| JP | A-6-241720 | 9/1994 |
| JP | A-6-244082 | 9/1994 |
| JP | A-6-267825 | 9/1994 |
| JP | 06-291023 | 10/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |

| | | |
|---|---|---|
| JP | A-6-349701 | 12/1994 |
| JP | A-7-69621 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-7-147223 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | 08-313842 | 11/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-215208 | 9/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | 10-303114 | 11/1998 |
| JP | A-10-294268 | 11/1998 |
| JP | A-10-303114 | 11/1998 |
| JP | A-10-340846 | 12/1998 |
| JP | 11-003849 | 1/1999 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | 11-135400 | 5/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |

| | | |
|---|---|---|
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | 2002-353105 | 6/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-17003 | 1/2003 |
| JP | A-2003-17404 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59803 | 2/2003 |
| JP | A-2003-59821 | 2/2003 |
| JP | A-2003-59826 | 2/2003 |
| JP | A-2003-68600 | 3/2003 |
| JP | A-2003-75703 | 3/2003 |
| JP | A-2003-81654 | 3/2003 |
| JP | A-2003-84445 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A 2003-195223 | 7/2003 |
| JP | A-2003-224961 | 8/2003 |
| JP | A-2003-229347 | 8/2003 |
| JP | A-2003-233001 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A 2003-279889 | 10/2003 |
| JP | A-2003-282423 | 10/2003 |
| JP | A-2003-297727 | 10/2003 |
| JP | A-2003-532281 | 10/2003 |
| JP | A-2003-532282 | 10/2003 |
| JP | A-2003-311923 | 11/2003 |
| JP | A 2004-006440 | 1/2004 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |

| | | |
|---|---|---|
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-85612 | 3/2004 |
| JP | A-2004-87987 | 3/2004 |
| JP | A 2004-093624 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-111569 | 4/2004 |
| JP | A-2004-111579 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-221253 | 8/2004 |
| JP | A-2004-224421 | 8/2004 |
| JP | A-2004-228497 | 8/2004 |
| JP | A 2004-233897 | 8/2004 |
| JP | A-2004-241666 | 8/2004 |
| JP | A-2004-247527 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | 2004-304135 | 10/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-11990 | 1/2005 |
| JP | A-2005-12228 | 1/2005 |
| JP | A 2005-018013 | 1/2005 |
| JP | A-2005-19628 | 1/2005 |
| JP | A-2005-19864 | 1/2005 |
| JP | A-2005-26634 | 1/2005 |
| JP | A 2005-503018 | 1/2005 |
| JP | A 2005-032909 | 2/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-93948 | 4/2005 |
| JP | A-2005-97057 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A 2005-136422 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A 2005-243870 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302825 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A 2005-537658 | 12/2005 |
| JP | A-2006-1821 | 1/2006 |
| JP | A-2006-5197 | 1/2006 |
| JP | A 2006-013518 | 1/2006 |
| JP | A-2006-17895 | 1/2006 |
| JP | A-2006-19702 | 1/2006 |
| JP | A-2006-24706 | 1/2006 |
| JP | A-2006-24819 | 1/2006 |
| JP | 2006-054328 | 2/2006 |
| JP | A-2006-32750 | 2/2006 |
| JP | A 2006-032963 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-508369 | 3/2006 |
| JP | 2006-113437 | 4/2006 |
| JP | A-2006-100363 | 4/2006 |
| JP | A-2006-100686 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A 2006-135312 | 5/2006 |

| | | | |
|---|---|---|---|
| JP | A-2006-140366 | | 6/2006 |
| JP | A-2006-170811 | | 6/2006 |
| JP | A-2006-170899 | | 6/2006 |
| JP | A-2006-177865 | | 7/2006 |
| JP | A-2006-184414 | | 7/2006 |
| JP | A-2006-194665 | | 7/2006 |
| JP | A 2006-228718 | | 8/2006 |
| JP | A 2006-519494 | | 8/2006 |
| JP | A-2006-250587 | | 9/2006 |
| JP | A-2006-253572 | | 9/2006 |
| JP | A-2006-269762 | | 10/2006 |
| JP | A-2006-278820 | | 10/2006 |
| JP | A 2006-284740 | | 10/2006 |
| JP | A-2006-289684 | | 10/2006 |
| JP | A-2006-309243 | | 11/2006 |
| JP | A 2006-344747 | | 12/2006 |
| JP | A-2006-349946 | | 12/2006 |
| JP | A-2006-351586 | | 12/2006 |
| JP | A-2007-5830 | | 1/2007 |
| JP | A 2007-019079 | | 1/2007 |
| JP | A-2007-43980 | | 2/2007 |
| JP | A-2007-48819 | | 2/2007 |
| JP | A-2007-51300 | | 3/2007 |
| JP | A 2007-505488 | | 3/2007 |
| JP | A-2007-87306 | | 4/2007 |
| JP | A-2007-93546 | | 4/2007 |
| JP | A-2007-103153 | | 4/2007 |
| JP | A-2007-113939 | | 5/2007 |
| JP | A-2007-119851 | | 5/2007 |
| JP | A-2007-120333 | | 5/2007 |
| JP | A-2007-120334 | | 5/2007 |
| JP | A-2007-142313 | | 6/2007 |
| JP | A-2007-144864 | | 6/2007 |
| JP | A 2007-150295 | | 6/2007 |
| JP | A-2007-170938 | | 7/2007 |
| JP | A-2007-187649 | | 7/2007 |
| JP | A-2007-207821 | | 8/2007 |
| JP | 2004-247527 | | 9/2007 |
| JP | A-2007-227637 | | 9/2007 |
| JP | A 2007-227918 | | 9/2007 |
| JP | A-2007-235041 | | 9/2007 |
| JP | A 2007-258691 | | 10/2007 |
| JP | A-2007-274881 | | 10/2007 |
| JP | A-2007-280623 | | 10/2007 |
| JP | A-2007-295702 | | 11/2007 |
| JP | A-2008-3740 | | 1/2008 |
| JP | A 2008-047744 | | 2/2008 |
| JP | A-2008-58580 | | 3/2008 |
| JP | A-2008-64924 | | 3/2008 |
| JP | A-2008-103737 | | 5/2008 |
| JP | A-2008-180492 | | 8/2008 |
| JP | A 2008-258605 | | 10/2008 |
| JP | A-2009-17540 | | 1/2009 |
| JP | A-2009-60339 | | 3/2009 |
| JP | A 2009-105396 | | 5/2009 |
| JP | A 2009-111369 | | 5/2009 |
| JP | A 2009-117801 | | 5/2009 |
| JP | A 2009-117812 | | 5/2009 |
| JP | A 2010-034486 | | 2/2010 |
| WO | WO 97/11411 | A1 | 3/1997 |
| WO | WO 98/24115 | A1 | 6/1998 |
| WO | WO 98/59364 | A1 | 12/1998 |
| WO | WO 99/23692 | A1 | 5/1999 |
| WO | WO 99/27568 | A1 | 6/1999 |
| WO | WO 99/31716 | A1 | 6/1999 |
| WO | WO 99/34255 | A1 | 7/1999 |
| WO | WO 99/49366 | A1 | 9/1999 |
| WO | WO 99-49504 | | 9/1999 |
| WO | WO 99/50712 | A1 | 10/1999 |
| WO | WO 99/66370 | A1 | 12/1999 |
| WO | WO 00/11706 | A1 | 3/2000 |
| WO | WO 00/067303 | | 4/2000 |
| WO | WO 00/67303 | A1 | 11/2000 |
| WO | WO 01/03170 | A1 | 1/2001 |
| WO | WO 01/10137 | A1 | 2/2001 |
| WO | WO 01/22480 | A1 | 3/2001 |
| WO | WO 01/27978 | A1 | 4/2001 |
| WO | WO 01/59502 | A1 | 8/2001 |
| WO | WO 01/65296 | A1 | 9/2001 |
| WO | WO 02/16993 | A1 | 2/2002 |
| WO | WO 02/063664 | A1 | 8/2002 |
| WO | WO 02/069049 | A2 | 9/2002 |
| WO | WO 02/080185 | A1 | 10/2002 |
| WO | WO 02/084720 | A2 | 10/2002 |
| WO | WO 02/084850 | A1 | 10/2002 |
| WO | WO 02/101804 | A1 | 12/2002 |
| WO | WO 02/103766 | | 12/2002 |
| WO | WO 03/023832 | A1 | 3/2003 |
| WO | WO 03/023833 | | 3/2003 |
| WO | WO 03/063212 | A1 | 7/2003 |
| WO | WO 03/077036 | A1 | 9/2003 |
| WO | WO 03/085708 | A1 | 10/2003 |
| WO | WO 2004/021529 | | 3/2004 |
| WO | WO 2004/051220 | A2 | 6/2004 |
| WO | WO 2004/051717 | A1 | 6/2004 |
| WO | WO 2004/053596 | A2 | 6/2004 |
| WO | WO 2004/053950 | A1 | 6/2004 |
| WO | WO 2004/053951 | A1 | 6/2004 |
| WO | WO 2004/053952 | A1 | 6/2004 |
| WO | WO 2004/053953 | A1 | 6/2004 |
| WO | WO 2004/053954 | A1 | 6/2004 |
| WO | WO 2004/053955 | A1 | 6/2004 |
| WO | WO 2004/053956 | A1 | 6/2004 |
| WO | WO 2004/053957 | A1 | 6/2004 |
| WO | WO 2004/053958 | A1 | 6/2004 |
| WO | WO 2004/053959 | A1 | 6/2004 |
| WO | WO 2004/061488 | A1 | 7/2004 |
| WO | WO 2004/071070 | A2 | 8/2004 |
| WO | WO 2004/077164 | | 9/2004 |
| WO | WO 2004/086468 | A1 | 10/2004 |
| WO | WO 2004/086470 | A1 | 10/2004 |
| WO | WO 2004/090956 | A1 | 10/2004 |
| WO | WO 2004/091079 | A1 | 10/2004 |
| WO | WO 2004/094940 | A1 | 11/2004 |
| WO | WO 2004/104654 | A1 | 12/2004 |
| WO | WO 2004/105106 | A1 | 12/2004 |
| WO | WO 2004/105107 | A1 | 12/2004 |
| WO | WO 2004/107048 | A2 | 12/2004 |
| WO | WO 2004/107417 | A1 | 12/2004 |
| WO | WO 2004/109780 | A1 | 12/2004 |
| WO | WO 2004/114380 | A1 | 12/2004 |
| WO | WO 2005/006415 | A1 | 1/2005 |
| WO | WO 2005/006418 | A1 | 1/2005 |
| WO | WO 2005/008754 | A1 | 1/2005 |
| WO | WO 2005/022615 | A1 | 3/2005 |
| WO | WO 2005/026843 | | 3/2005 |
| WO | WO 2005/029559 | A1 | 3/2005 |
| WO | WO 2005/036619 | A1 | 4/2005 |
| WO | WO 2005/036620 | A1 | 4/2005 |
| WO | WO 2005-036622 | A1 | 4/2005 |
| WO | WO 2005-036623 | A1 | 4/2005 |
| WO | WO 2005/041276 | A1 | 5/2005 |
| WO | WO 2005/048325 | A1 | 5/2005 |
| WO | WO 2005/048326 | A1 | 5/2005 |
| WO | WO 2005/057636 | A1 | 6/2005 |
| WO | WO 2005/067013 | A1 | 7/2005 |
| WO | WO 2005/071717 | A1 | 8/2005 |
| WO | WO 2005/076321 | A1 | 8/2005 |
| WO | WO 2005/076323 | A1 | 8/2005 |
| WO | WO 2005/081291 | A1 | 9/2005 |
| WO | WO 2005/081292 | A1 | 9/2005 |
| WO | WO 2005/104195 | A1 | 11/2005 |
| WO | WO 2006-006730 | A1 | 1/2006 |
| WO | WO 2006-016551 | A1 | 2/2006 |
| WO | WO 2006/019124 | A1 | 2/2006 |
| WO | WO 2006-025341 | A1 | 3/2006 |
| WO | WO 2006-028188 | A1 | 3/2006 |
| WO | WO 2006-030727 | A1 | 3/2006 |
| WO | WO 2006/030910 | A1 | 3/2006 |
| WO | WO 2006/035775 | | 4/2006 |
| WO | WO 2006-049134 | A1 | 5/2006 |
| WO | WO 2006/051909 | A1 | 5/2006 |
| WO | WO 2006-064851 | A1 | 6/2006 |
| WO | WO 2006-068233 | A1 | 6/2006 |
| WO | WO 2006-077958 | A1 | 7/2006 |
| WO | WO 2006/080285 | | 8/2006 |
| WO | WO 2006/085524 | A1 | 8/2006 |
| WO | WO 2006/085626 | A1 | 8/2006 |

| | | | |
|---|---|---|---|
| WO | WO 2006/097135 | | 9/2006 |
| WO | WO 2006/100889 | A1 | 9/2006 |
| WO | WO 2006-118108 | A1 | 11/2006 |
| WO | WO 2007/003563 | A1 | 1/2007 |
| WO | WO 2007/004567 | | 1/2007 |
| WO | WO 2007/004567 | A | 1/2007 |
| WO | WO 2007/013888 | | 2/2007 |
| WO | WO 2007-018127 | A1 | 2/2007 |
| WO | WO 2007/055237 | A1 | 5/2007 |
| WO | WO 2007/055373 | A1 | 5/2007 |
| WO | WO 2007/066692 | A1 | 6/2007 |
| WO | WO 2007/066758 | A1 | 6/2007 |
| WO | WO 2007/097198 | A1 | 8/2007 |
| WO | WO 2007/100081 | A1 | 9/2007 |
| WO | WO 2007/132862 | A1 | 11/2007 |
| WO | WO 2007/141997 | A1 | 12/2007 |
| WO | WO 2008/041575 | A1 | 4/2008 |
| WO | WO 2008/059748 | A1 | 5/2008 |
| WO | WO 2008/061681 | | 5/2008 |
| WO | WO 2006-343023 | | 6/2008 |
| WO | WO 2008/065977 | A1 | 6/2008 |
| WO | WO 2008/075613 | A1 | 6/2008 |
| WO | WO 2008/078688 | A1 | 7/2008 |
| WO | WO 2008/090975 | A1 | 7/2008 |
| WO | WO 2008/131928 | | 11/2008 |
| WO | WO 2008/139848 | A1 | 11/2008 |
| WO | WO 2009/026947 | | 3/2009 |
| WO | WO 2009/034109 | | 3/2009 |
| WO | WO 2009/153925 | A1 | 12/2009 |
| WO | WO 2009/157154 | A1 | 12/2009 |
| WO | WO 2010/001537 | A1 | 1/2010 |

OTHER PUBLICATIONS

Written Opinion of the International Searching Authority for PCT/JP2008/066933 (mailed Jan. 13, 2009).
Chinese Office Action issued in related application CN 200880020867.6, mailed Jul. 26, 2011.
Office Action dated Jun. 30, 2011, in counterpart Chinese Patent Application No. 200880021453.5.
Office Action dated Jul. 5, 2011, in Chinese Patent Application No. 200880100940.0.
Office Action dated Jul. 19, 2011, in U.S. Appl. No. 12/191,821.
Action dated Jul. 28, 2011, in U.S. Appl. No. 12/252,283.
Gao, Y. et al., "Research on high-quality projecting reduction lithography system based on digital mask technique," Optik, WissenschaftlicheVerlag Gmbh. Stuttgart, vol. 116, No. 7, pp. 303-310, Aug. 2005.
Notice of Allowance and Notice of Allowability mailed on Nov. 28, 2011, in U.S. Appl. No. 12/952,197, filed Nov. 22, 2010.
Office Action mailed on Nov. 3, 2011, in Chinese Application No. 200880015567.9.
Office Action mailed on Dec. 12, 2011, in European Application No. 08 837 064.8.
Office Action mailed on Dec. 8, 2011, in U.S. Appl. No. 12/256,055, filed on Oct. 22, 2008.
Nov. 17, 2011 Office Action issued in Chinese Application No. 200880024375.4 (with English translation).
Dec. 15, 2011 Notice of Allowance issued in U.S. Appl. No. 12/245,021.
Feb. 7, 2012 Notice of Allowance issued in U.S. Appl. No. 12/191,821.
Office Action mailed on Nov. 7, 2011, in U.S. Appl. No. 12/250,519, filed on Oct. 13, 2008.
Dec. 20, 2011 Office Action issued in CN Application No. 200980101546.3 (with English translation).
Jan. 15, 2009 International Search Report issued in International Application No. PCT/JP2008/068319.
Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.
Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Jul. 12, 2011 Office Action issued in Chinese Patent Application No. 200880018312.8 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Mar. 24, 2011 Office Action issued in U.S. Appl. No. 12/191,821.
Aug. 26, 2011 Office Action issued in U.S. Appl. No. 12/245,021.
Jul. 18, 2011 Office Action issued in U.S. Appl. No. 12/250,519.
Jan. 3, 2011 Office Action issued in U.S. Appl. No. 12/262,930.
May 13, 2011 Office Action issued in U.S. Appl. No. 12/952,197.
Feb. 24, 2012 Notice of Allowance issued in U.S. Appl. No. 12/252,283.
Jun. 20, 2012 Office Action issued in Chinese Patent Application No. 200880100940.0 (with translation).
Jul. 17, 2012 Office Action issued in U.S. Appl. No. 12/250,519.
May 29, 2012 Office Action issued in U.S. Appl. No. 13/417,602.
Feb. 22, 2012 Chinese Office Action issued in Chinese Application No. 200880020867.6 (with translation).
May 9, 2012 European Office Action issued in European Application No. 08 830 323.5.
May 23, 2012 Notice of Allowance issued in U.S. Appl. No. 12/191,821.
Jul. 27, 2012 Search Report issued in European Patent Application No. 12171299.6.
Jun. 18, 2012 Office Action issued in Chinese Patent Application No. 200880021453.5 (with translation).
Jul. 26, 2012 Office Action issued in Chinese Patent Application No. 200880020867.6 (with translation).
Aug. 24, 2012 Notice of Allowance issued in U.S. Appl. No. 12/245,021.
Aug. 27, 2012 Final Office Action issued in U.S. Appl. No. 12/256,055.
Office Action issued Sep. 14, 2012 in U.S. Appl. No. 13/484,051.
Search Report issued Oct. 2, 2012 in European Patent Application No. 12173803.3.
Notice of Allowance issued Sep. 28, 2012 in U.S. Appl. No. 12/252,283.
Search Report issued Oct. 18, 2012 in European Patent Application No. 09015718.1.
Office Action issued Oct. 17, 2012 in European Patent Application No. 09 015 716.5.
Search Report issued Oct. 30, 2012 in European Patent Application No. 12173802.5.
Office Action issued Oct. 10, 2012 in Chinese Patent Application No. 200880015567.9 (with English-language translation).
Office Action issued Oct. 17, 2012 in European Patent Application No. 08 841 021.2.

Search Report issued Sep. 21, 2012 in European Patent Application No. 12173801.7.
Notice of Allowance issued Oct. 23, 2012 in Japanese Patent Application No. P2008-263405 (with translation).
Notice of Reasons for Rejection issued Nov. 20, 2012 in Japanese Application No. P2008261214 (with translation).
Notice of Reasons for Rejection issued Nov. 20, 2012 in Japanese Application No. P2008261215 (with translation).
Office Action issued Dec. 18, 2012 in U.S. Appl. No. 12/250,519.
Office Action issued Dec. 26, 2012 in Chinese Patent Application No. 200980101546.3 (with translation).
Notice of Allowance issued Jan. 15, 2013 in U.S. Appl. No. 12/191,821.
Notice of Allowance issued Jan. 16, 2013 in U.S. Appl. No. 13/417,602.
Notice of Allowance issued Jan. 23, 2013 in U.S. Appl. No. 12/952,197.
Notice of Allowance issued Jan. 23, 2013 in U.S. Appl. No. 12/252,283.
Notice of Reasons for Rejection issued Jan. 15, 2013 in Japanese Patent Application No. P2008-259522 (with translation).
Mar. 11, 2013 Office Action issued in European Patent Application No. 08 847 031.5.
Mar. 19, 2013 Office Action issued in European Patent Application No. 08 830 323.5.
Mar. 12, 2013 Office Action issued in Chinese Patent Application No. 200880024806.7 (with translation).
Apr. 5, 2013 Notice of Allowance issued in U.S. Appl. No. 13/484,051.
Mar 10, 2013 Office Action issued in European Patent Application No. 12171299.6.
Apr. 3, 2013 Office Action issued in Chinese Patent Application No. 200880100940.0 (with translation).
May 14, 2013 Office Action issued in Japanese Patent Application No. P2010-506474 (with translation).
Jun. 17, 2013 Office Action issued in European Patent Application No. 12173802.5.

* cited by examiner

ILLUMINATION OPTICAL SYSTEM, EXPOSURE APPARATUS, AND DEVICE MANUFACTURING METHOD

CROSS-REFERENCE TO RELATED APPLICATIONS

This application claims the benefit of Japanese Patent Application No. 2007-269188, filed on Oct. 16, 2007, U.S. Provisional Application No. 60/960,947, filed on Oct. 22, 2007, Japanese Patent Application No. 2008-173244, filed on Jul. 2, 2008, and U.S. Provisional Application No. 61/129,614, filed on Jul. 8, 2008.

FIELD

The present invention relates to an illumination optical system for use in an exposure apparatus that manufactures a device, such as a semiconductor device, a liquid crystal display device, an imaging device, and a thin-film magnetic head, in a photolithography process, an exposure apparatus including such an illumination optical system, and a method for manufacturing a device with such an exposure apparatus.

BACKGROUND

In recent years, the integration of patterns that are formed on a mask has become higher. Thus, to accurately transfer a fine pattern onto a wafer, a mask pattern must be illuminated with the optimal illuminance distribution. Accordingly, a technique that has drawn attention performs modified illumination at a pupil position of an illumination optical system for an exposure apparatus to form an annular-shaped or multipole-shaped (e.g., quadrupole) light intensity distribution and varies the light intensity distribution on a secondary light source, which is formed on a rear focal plane of a micro-fly's eye lens. This technique increases the focal depth and resolution of a projection optical system.

To transform light from a light source to light having an annular-shaped or multipole-shaped light intensity distribution at a pupil position, for example, Japanese Laid-Out Patent Publication No. 2002-353105 discloses an exposure apparatus including a movable multi-mirror (e.g., digital micromirror device (DMD), which includes many microscopic elements mirrors that are arranged in an array. The inclination angle and inclination direction of each of the element mirrors are varied to form a predetermined light intensity distribution at a pupil position of the illumination optical system or a position conjugated with the pupil position (secondary light source position formed at a rear focal plane of a micro-fly's eye lens). In this exposure apparatus, light entering each mirror element is reflected by a reflection surface of the mirror element, deflected by a predetermined angle in a predetermined direction, and transformed to light having a predetermined light intensity distribution at the pupil position of the illumination optical system. Exposure is performed by setting the inclination angle and inclination direction of each mirror element in the movable multi-mirror so that a secondary light source image formed on a rear focal plane of the micro-fly's eye lens has the optimal light intensity distribution that corresponds to the pattern or the like of the mask during exposure.

DISCLOSURE OF THE INVENTION

In the above-described exposure apparatus, a laser light source is used as the light source. However, the light intensity is not uniform in the cross-section of the laser light emitted from the laser light source. Accordingly, when using such laser light to form an annular-shaped or multi-pole shaped light intensity distribution at the pupil position of the illumination optical system, non-uniformity of light intensity occurs in a light distribution shape (cross-section of light beam).

It is an object of the present invention to provide an illumination optical system, an exposure apparatus including such an illumination optical system, and a method for manufacturing a device with such an exposure apparatus that easily forms the desired light intensity distribution with uniform illumination at the pupil position of the illumination optical system or a position conjugated with the pupil position even when non-uniformity occurs in the cross-section of the light.

To summarize the present invention, several aspects, advantages, and novel features of the present invention are described below. However, such advantages may not all be achieved in certain aspects of the present invention. In such a manner, the present invention may be practiced so as to achieve or optimize one advantage or a series of advantages without having to achieve the advantages suggested or proposed herein.

The structure of an embodiment of the present invention will now be discussed. However, the present invention is not limited to this embodiment.

An illumination optical system according to one embodiment of the present invention illuminates an irradiated plane with illumination light provided from a light source. The illumination optical system includes a spatial light modulator which is arranged in an optical path of the illumination optical system and cooperates with part of the illumination optical system to form a desired light intensity distribution at a pupil position of the illumination optical system or a position optically conjugated with the pupil position. A detection unit including a light receiving surface receiving some of the illumination light detects the light intensity distribution of the illumination light at a position in an optical path extending from the light source to the spatial light modulator. A control unit controls the spatial light modulator based on the light intensity distribution detected by the detection unit.

An exposure apparatus according to one embodiment of the present invention transfers a predetermined pattern onto a photosensitive substrate. The exposure apparatus includes the illumination optical system according to the present invention which illuminates the pattern that is arranged on an irradiated plane.

A method for manufacturing a device according to one embodiment of the present invention exposes a predetermined pattern onto a photosensitive substrate using the exposure apparatus according to the present invention, develops the photosensitive substrate onto which the pattern has been transferred to form a mask layer shaped in correspondence with the pattern on a surface of the photosensitive substrate, and processes the surface of the photosensitive substrate through the mask layer.

The exposure apparatus according to one embodiment of the present invention includes a detection unit which detects the light intensity distribution of the illumination light at a position in an optical path extending from the light source to the spatial light modulator. Thus, based on the detection result, the spatial light modulator can be controlled to form the desired light intensity distribution at the pupil position of the illumination optical system or a position optically conjugated with the pupil position.

Further, the exposure apparatus according to one embodiment of the present invention illuminates a mask using an illumination optical system according to the present invention. Thus, the pattern of a mask can be exposed onto a photosensitive substrate with a high resolution and high throughput.

The method for manufacturing a device according to one embodiment of the present invention performs exposure with an exposure apparatus including an illumination optical system according to the present invention. Thus, devices can be manufactured with a high resolution and high throughput.

A general architecture that implements the various features of the invention will now be described with reference to the drawings. The drawings and the associated descriptions are provided to illustrate embodiments of the invention and not to limit the scope of the invention.

BEST MODE FOR CARRYING OUT THE INVENTION

Figure 1:
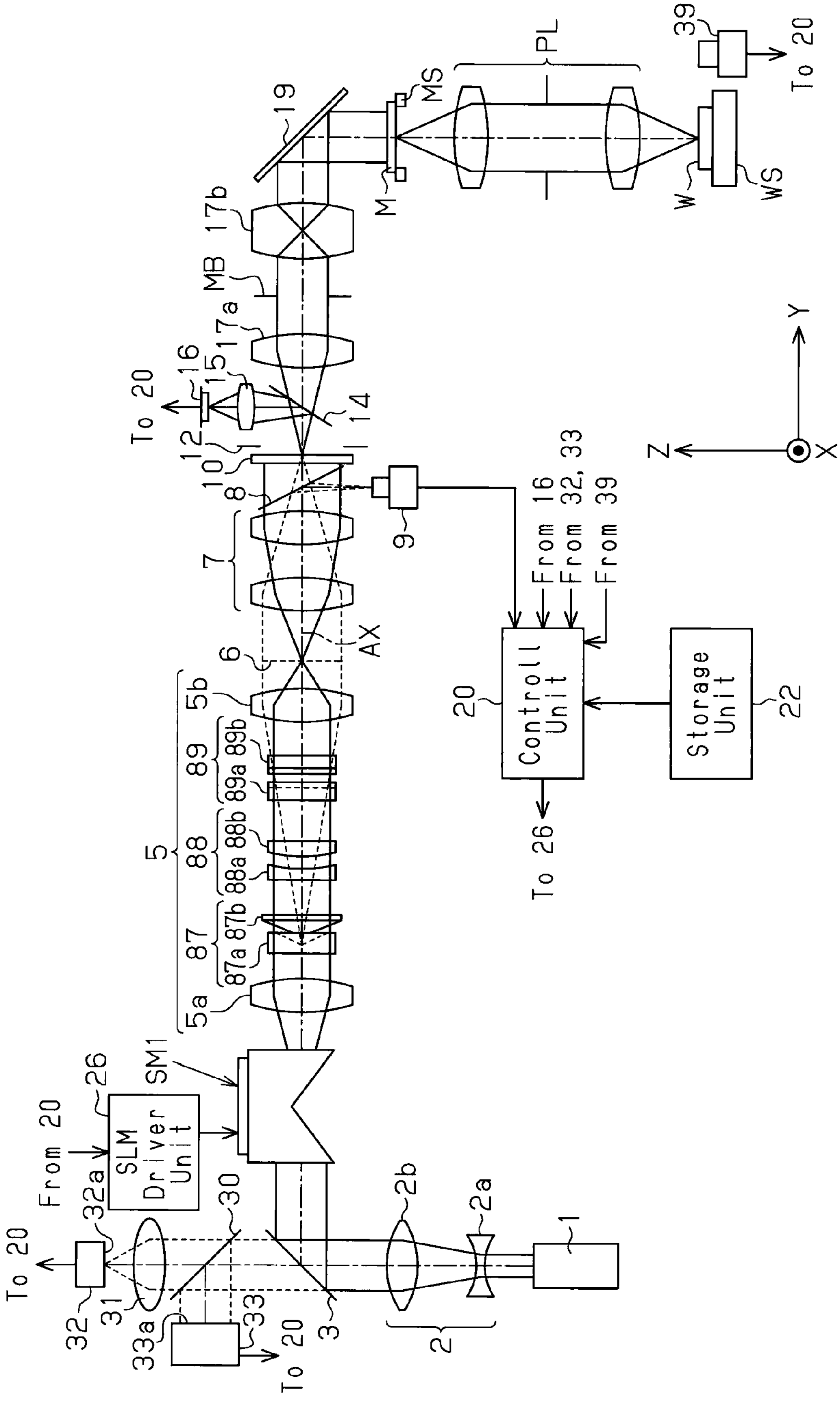
FIG. 1 is a schematic diagram showing an exposure apparatus according to an embodiment.

An exposure apparatus according to an embodiment of the present invention will now be discussed with reference to the drawings. FIG. 1 is a schematic diagram showing the structure of an exposure apparatus according to the embodiment. In the description hereafter, an XYZ orthogonal coordinate system is set as shown in FIG. 1, and the positional relationship of each member will be described with reference to the XYZ orthogonal coordinate system. The XYZ orthogonal coordinate system is set so that the X axis and the Y axis are parallel to a wafer W, and the Z axis is orthogonal to the wafer W.

With reference to FIG. 1, exposure light (illumination light) is supplied from a laser light source 1 to the exposure apparatus of the present embodiment. The laser light source 1 may be, for example, an ArF excimer laser light source, which generates light having a wavelength of 193 nm, or a KrF excimer laser light source, which generates light having a wavelength of 248 nm. The laser light source 1 emits generally parallel light in the Z direction. The light, which has a rectangular cross-section that is elongated in the X direction, enters a beam expander 2, which is formed by a pair of lenses 2*a* and 2*b*. The lenses 2*a* and 2*b* respectively have a negative refractive power and a positive refractive power in a YZ plane as viewed in FIG. 1. Accordingly, the light that enters the beam expander 2 is magnified on a YZ plane as viewed in FIG. 1 and shaped into light having a predetermined rectangular cross-section. The parallel light that has passed through the beam expander 2, which serves as a shaping optical system, enters a beam splitter 3.

The light that has passed through the beam splitter 3 enters a detection unit, which includes a beam splitter 30, a lens 31, a first CCD imaging unit 32, and a second imaging unit 33. In the detection unit (30 to 33), the lens 31 converges the parallel light that has passed through the beam splitter 30 onto a light receiving surface, or detection surface 32*a*, of the first CCD imaging unit 32. Further parallel light reflected by the beam splitter 30 falls on a light receiving surface, or detection surface 33*a*, of the second CCD imaging unit 33.

In accordance with the inclination of the parallel light from the beam splitter 30, the lens 31 directs the parallel light to a position on the detection surface 32*a* of the first CCD imaging unit 32. Thus, by detecting the position at which light converges on the detection surface 32*a* of the first CCD imaging unit 32, the inclination angle of the parallel light from the beam splitter 30 and, consequently, the inclination angle of the light reflected by the beam splitter 3 and directed toward a spatial light modulator S1, which will be described later, can be determined. The first CCD imaging unit 32 is one example of an incidence angle detection unit that detects the incidence angle at which illumination light enters the spatial light modulator.

The illuminance distribution in a cross-section of the light that has passed through the beam splitter 30 is detected with the detection surface 33*a* of the second CCD imaging unit 33. By obtaining the center of the illuminance distribution, displacement of the parallel light from the beam splitter 30 and consequently, displacement of the light reflected by the beam splitter 3 and directed to the spatial light modulator S1 can be obtained.

The first and second CCD imaging units 32 and 33 can receive a plurality of light pulses from the light source 1 and can output a detection signal every receiving one or more light pulses.

To attenuate the illuminance of the light directed toward the first and second CCD imaging units 32 and 33 when necessary, a detachable light attenuation filter formed by a neutral density (ND) filter having a predetermined transmittance may be arranged between the beam splitter 3 and the first and second CCD imaging units 32 and 33. Attachment and detachment of the light attenuation filter and gain adjustment of the first and second CCD imaging units 32 and 33 enable the detection signal level of each CCD imaging unit to be kept within an appropriate range.

The detection signals from the first and second CCD imaging units 32 and 33 that include information on light angle deviation and light position deviation are sent to a control unit 20. The light reflected by the beam splitter 3 and deflected in the Y direction enters the spatial light modulation unit SM1.

Figure 2:
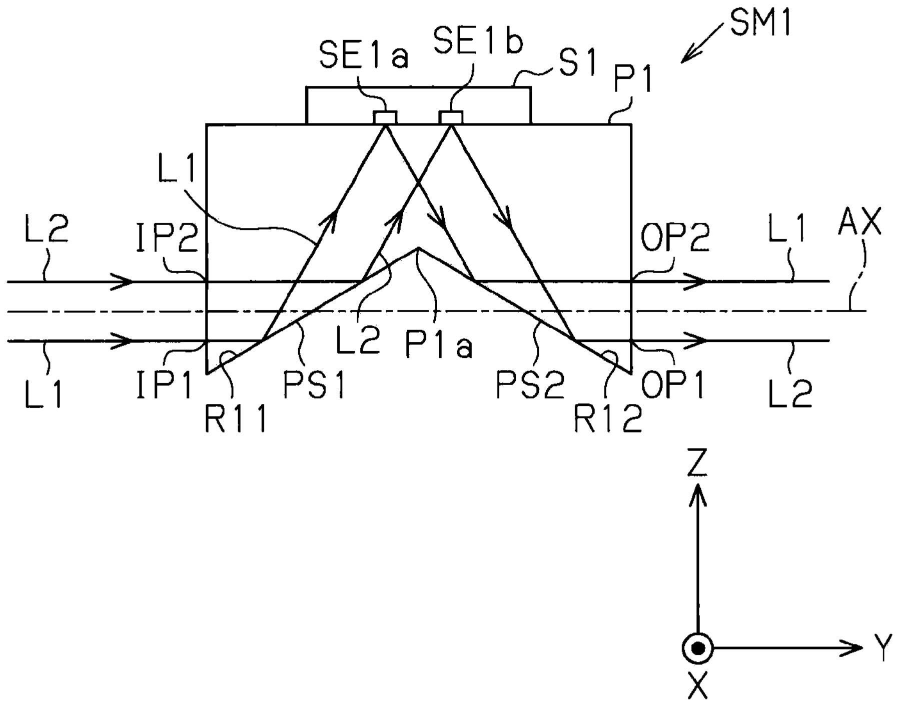
FIG. 2 is a diagram showing the structure of a spatial light modulation unit in the embodiment.

As shown in FIG. 2, the spatial light modulation unit SM1 includes a prism P1 and a spatial light converter S1, which is integrally attached to the prism P1. The prism P1, which is a rectangular parallelepiped, has a side surface in which a V-shaped, wedge-like notch is formed. That is, the prism P1 has a V-shaped notch formed by two planes PS1 and PS2, which intersect each other at an obtuse angle. The two planes PS1 and PS2 are in contact with a straight line P1*a*, which extends along the X axis shown in FIG. 2. The spatial light modulator S1 is attached to the prism P1 on a side surface that is opposite the V-shaped notch. Inner sides of the two planes PS1 and PS2 function as first and second reflection surfaces R11 and R12.

The prism P1 is arranged so that the side surface to which the spatial light modulator S1 is attached is parallel to the optical axis AX and so that the first reflection surface R11 is located at the side closer to the beam splitter 3 and the second reflection surface R12 is located at the side closer to an afocal lens, which will be described later. The first reflection surface R11 of the prism P1 reflects incident light in the direction of the spatial light modulator S1 (parallel to the optical axis AX). The spatial light modulator S1, which is arranged in an optical path between the first reflection surface R11 and the second reflection surface R12, reflects the light reflected by the first reflection surface R11 toward the second reflection surface R12. The reflection surface R12 of the prism P1 reflects and emits the light reflected by the spatial light modulator S1 toward the afocal lens 5.

Figure 3A:
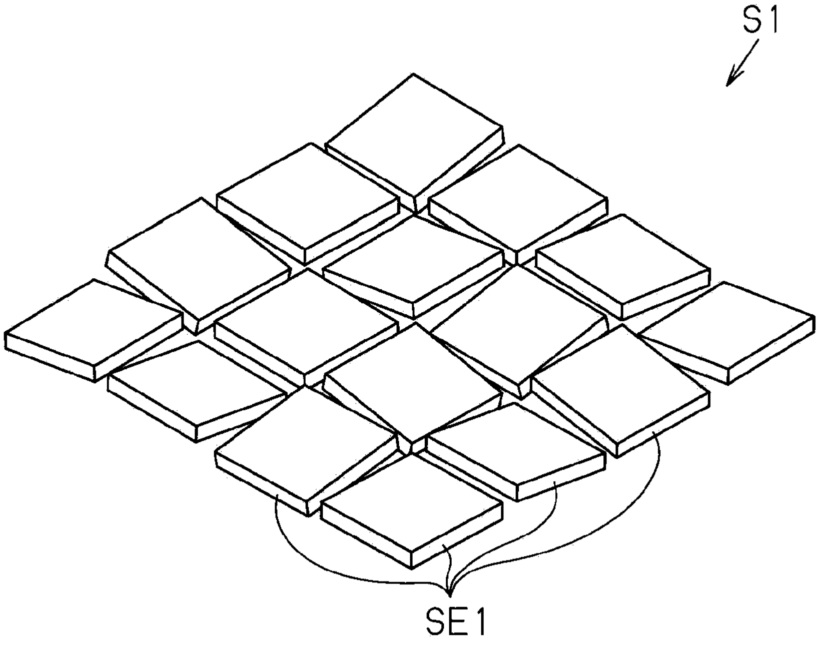
FIG. 3 is a diagram showing the structure of a spatial light modulator in the spatial light modulation unit of the embodiment.
Figure 3B:
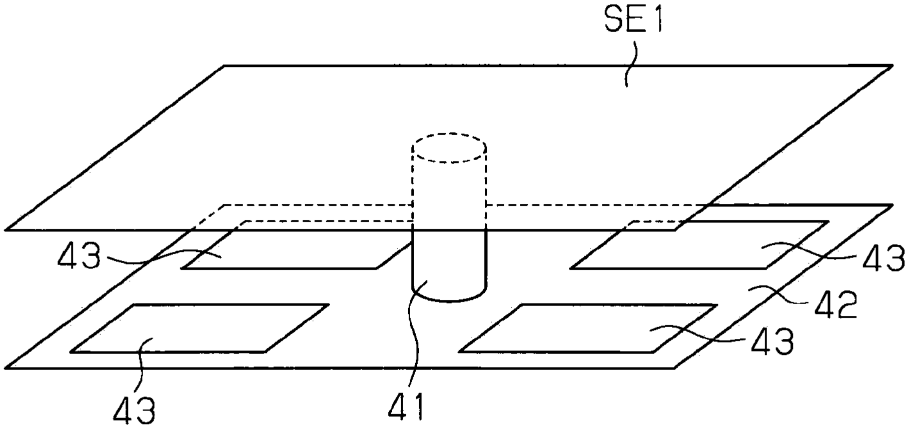

In accordance with the position at which the light reflected by the first reflection surface R11 enters the spatial light modulator S1, the spatial light modulator S1 spatially modulates the light. As shown in FIG. 3, the spatial light modulator S1 includes a two-dimensional array of a plurality of microscopic mirror elements SE1. For example, in the light that enters the spatial light modulator S1, a light ray L1 falls on a mirror element SE1*a*, which is one of the plurality of mirror elements SE1 of the spatial light converter S1, and a light ray L2 falls on a mirror element SE1*b*, which is one of the plurality of mirror elements SE1 of the spatial light converter S1 differing from the mirror element SE1*a*. The mirror elements SE1*a* and SE1*b* respectively perform spatial modulation on the light rays L1 and L2 in accordance with their positions.

The prism P1 is arranged so that the air-equivalent length from incident positions IP1 and IP2 at which the light rays L1 and L2 enter the prism P1 to the mirror elements SE1*a* and SE1*b* and then to emission positions OP1 and OP2 from which light is emitted is equal to the air-equivalent length from positions corresponding to the incident positions IP1 and IP2 to positions corresponding to the emission positions OP1 and OP2 when the optical path of exposure light does not include the prism P1. The air-equivalent length is the optical path length when an optical path length in an optical system is converted to air having a refractive index of one. The air-equivalent length of a medium having refractive index n is obtained by multiplying the physical or actual optical path length of the medium by 1/n.

As shown in FIG. 3(*a*), the spatial light modulator S1 is a movable multi-mirror including a plurality of mirror elements SE1, which are microscopic reflection elements. Each of the mirror elements SE1 is movable and has a reflection surface. In each mirror element SE1, the orientation of the reflection surface, that is, the inclination angle and inclination direction of the reflection surface is independently driven and controlled by a spatial light modulator (SLM) drive unit 26, which is controlled by a control unit 20. Each mirror element SE1 is continuously rotatable by a desired rotation angle about two rotation axes that extend perpendicular to each other and parallel to the reflection surface. That is, the mirror elements SE1 are each controllable so as to inline two-dimensionally along the reflection surface.

As shown in FIG. 3(*b*), one example of a drive mechanism for a mirror element SE1 includes a rod member 41, which supports the mirror element SE1 in a manner enabling inclination about two perpendicular axes in the reflection surface, a support substrate 42, which supports the rod member 41, four electrodes 43, which are arranged on the support substrate 42 so as to surround the rod member 41, and four electrodes (not shown), which are arranged on the rear surface of the mirror element SE1 facing toward the four electrodes 43. In this example, the spatial light modulator (SLM) drive unit 26 controls the potential difference between each of the four electrodes 43 and the corresponding electrode on the rear surface of the mirror element SE1 to control the electrostatic force that acts between the electrodes so as to swing and incline mirror element SE1. This continuously controls the inclination angle of the mirror element SE1 about the two perpendicular axes of the reflection surface within a predetermined variable range. The structure of the spatial light modulator S1 is disclosed, for example, in Japanese Laid-Open Patent Publication No. 2002-353105. The electrodes 43 shown in FIG. 3(*b*) are arranged at the apexes (corners) of the rectangular mirror element SE1 but may be arranged instead at a position corresponding to each side of the mirror element SE1.

The drive mechanism for the mirror element SE1 is not limited to the structure of the present embodiment and any other mechanism may be used.

Here, the mirror elements SE1 have square outlines and are flat but are not limited in such a manner. However, from the viewpoint of light utilization efficiency, it is preferable that the mirror elements SE1 have outlines enabling an arrangement that eliminates gaps. It is also preferable that the gap between adjacent mirror elements SE1 be minimized. Further, it is preferable that the mirror elements SE1 be as small as possible so that fine changes can be made to the illumination conditions. Moreover, the reflection surfaces of the mirror elements SE1 do not have to be planar surfaces and may be curved surfaces such as concave surfaces and convex surfaces.

The spatial light modulator S1 is capable of performing modified illumination, which forms a desired light intensity distribution that is circular, annular, dipole-shaped, quadrupole-shaped, or the like at a pupil position (pupil surface) of an illumination optical system. Specifically, a storage unit 22, which is accessible by the control unit 20, stores information, for example, in the form of a lookup table, on the inclination angle and inclination direction of the mirror elements SE1 in the spatial light modulator S1 to form a light intensity distribution that is circular, annular, dipole-shaped, quadrupole-shaped, or the like at the pupil position of the illumination optical system when the incident light has no light intensity variations.

When detecting variations (non-uniformity) in the light intensity of the illumination light at a position in the optical path extending from the light source 1 to the spatial light modulator S1 based on the detection result of the detection unit (30 to 33), to form light distributions that are circular, annular, dipole-shaped, quadrupole-shaped, or the like, the control unit 20 performs an optimization calculation to uniform the light distribution and calculates a corrected inclination angle and corrected inclination direction of each mirror element SE1. Based on the corrected inclination angle and inclination direction, the control unit 20 sends a control signal to the SLM drive unit 26, and the SLM drive unit 26 controls the inclination angle and inclination direction of each mirror element SE1 to form the desired light intensity distribution at the pupil position of the illumination optical system or a position optically conjugated with the pupil position.

The correction operation will now be discussed in more detail. For each of the plurality of mirror elements SE1 in the spatial light modulator S1 of the spatial light modulation unit SM1, the control unit 20 obtains the intensity of the light entering the mirror element SE1 from the light intensity distribution in the cross-section of the illumination light detected by the detection unit (30 to 33). Then, the control unit 20 calculates the light intensity distribution in the light distribution shape formed at the pupil position of the illumination optical system using the information stored in the storage unit 22 on the inclination angle and inclination direction of each mirror element SE1 and the information related to the intensity of the light entering each mirror element SE1.

Further, the control unit 20 obtains the corrected inclination angle and corrected inclination direction of each mirror element SE1, for example, though an appropriate minimization process, such as least squares or attenuation least squares using the inclination angle and inclination direction of each mirror element SE1 as a variable and the light intensity distribution in the light intensity distribution shape that is to be formed at a pupil position in the illumination optical system as a target value. The correction operation does not use a Fourier transform that would require time for calculation. Thus, the inclination angle and inclination direction of each mirror element SE1 is quickly calculated.

Further, when the light entering the spatial light modulation unit SM1 inclines from a predetermined initial state, displacement of the light distribution shaped formed at the pupil position of the illumination optical system would occur in the pupil plane. Therefore, in the present embodiment, the control unit 20 corrects the inclination angles of the plurality of mirror elements SE1 in the spatial light modulator S1 of the spatial light modulation unit SM1 based on information on angle deviations of the illumination light detected by the detection unit (30 to 33).

Specifically, the control unit 20 uses the information on the angle deviation of the illumination light detected by the detection unit (30 to 33) to correct the inclination angle and inclination direction of each mirror element SE1 stored in the storage unit 22 in the form of a lookup table. For example, when the angle deviation of the illumination light is $\theta$, the angle deviation becomes $2\theta$ when the light is reflected by each mirror element SE1. The inclination angle of each mirror element SE1 for correcting the angle deviation $2\theta$ of the reflection light is $-\theta$. Thus, the control unit 20 adds the correction angle $-\theta$ to the information on the inclination angle and inclination direction of each mirror element SE1 stored in the form of a lookup table to obtain the corrected inclination angle and corrected inclination direction of each mirror element SE1. This correction operation enables the elimination of an optical axis inclination correction mechanism that would be arranged between the light source and the main body of the exposure apparatus.

In the present embodiment, the spatial light modulator S1 is controlled so that the light distribution shape of incident light is transformed from a rectangular shape to an annular shape. The light that passes through the spatial light modulation unit SM1 enters the afocal lens 5 (relay optical system) and forms an annular light intensity distribution near a pupil position of the afocal lens 5 (and consequently the illumination optical system) or near the pupil position. The afocal lens 5 is an afocal system (non-focal optical system) in which its front focal point is located at the same position as the spatial light modulator S1 and its rear focal point is located at the same position as a predetermined plane 6, which is indicated by broken lines in the drawing. Accordingly, the light entering the spatial light modulator S1 forms an annular light intensity distribution at the pupil position of the afocal lens 5 and is then emitted from the afocal lens 5 as parallel light.

In an optical path between a front lens group 5*a* and rear lens group 5*b* of the afocal lens 5, a conical axicon system 87, a first cylindrical lens pair 88, and a second cylindrical lens pair 89 are arranged at or near the pupil position of the illumination optical system from the light source side.

Figure 4:
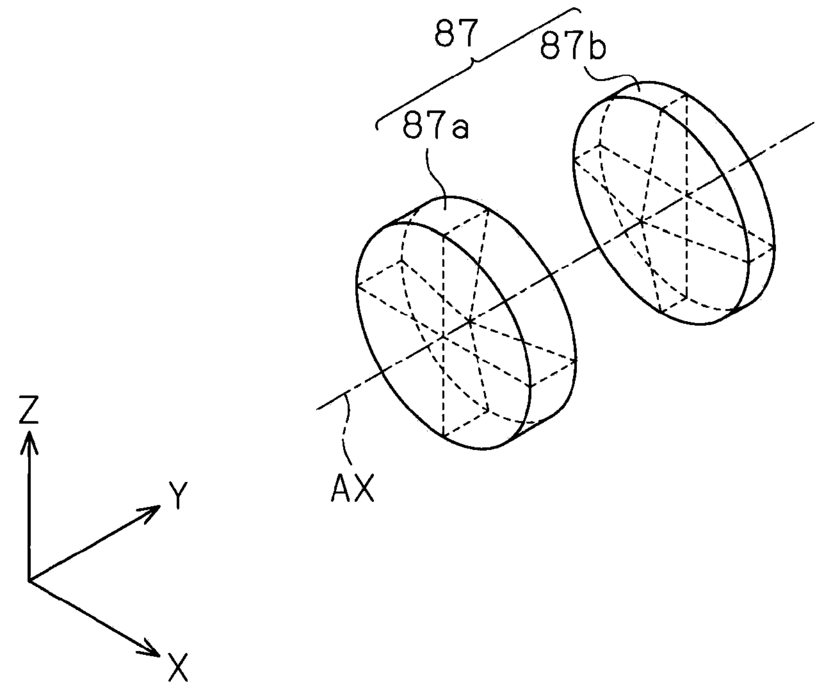
FIG. 4 is a schematic diagram showing the structure of a conical axicon system in an illumination optical system according to the embodiment.

FIG. 4 is a schematic diagram showing the conical axicon system 87, which is arranged at or near the pupil position of the illumination optical system. The conical axicon system 87 includes from the light source side a first prism 87*a* and a second prism 87*b*. The first prism 87*a* includes a concave, conical refraction surface (concave refraction surface). The second prism 87*b* includes a convex, conical refraction surface (convex refraction surface) that is formed to be complement so as to enable contact with the concave, conical refraction surface of the first prism 87*a*. The first prism 87*a* is arranged so that its planar surface faces toward the light source side and its concave, conical refraction surface faces toward a mask M. The second prism 87*b* is arranged so that its convex, conical refraction surface faces toward the light source and its planar surface faces toward the mask M.

At least either one of the first prism 87*a* and the second prism 87*b* is movable along the optical axis AX so that the interval between the concave, conical refraction surface of the first prism 87*a* and the convex, conical refraction surface of the second prism 87*b* (hereinafter, referred to as the interval of the conical axicon system 87) is variable. In a state in which the concave, conical refraction surface of the first prism 87*a* and the convex, conical refraction surface of the second prism 87*b* are in contact with each other, the conical axicon system 87 functions as a plane parallel plate and does not affect an annular secondary light source that is formed by a micro-lens array 10, which will be described later. However, when separating the concave, conical refraction surface of the first prism 87*a* and the convex, conical refraction surface of the second prism 87*b*, the conical axicon system 87 functions as a so-called beam expander. Accordingly, when varying the interval in the conical axicon system 87, the incident angle of the light entering the predetermined plane 6, which is indicated by the broken line in FIG. 1, is varied.

Figure 5A:
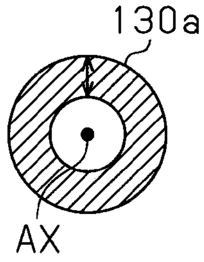
FIG. 5 is a diagram illustrating the operation of the conical axicon system with respect to a secondary light source formed through annular illumination according to the embodiment.
Figure 5B:
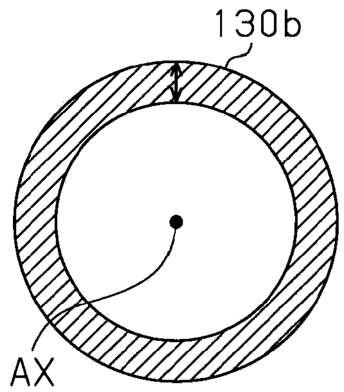

FIG. 5 includes drawings illustrating the operation of the conical axicon system 87 with respect to a secondary light source formed through annular illumination. FIG. 5(*a*) is a drawing showing an annular secondary light source 130*a* that is in the smallest state in which the interval in the conical axicon system 87 is zero and the focal length of a zoom lens 7, which will be described later, is set to a minimum value (hereinafter, referred to as the "standard state"). FIG. 5 (*b*) is a drawing showing an annular secondary light source 130*b* formed in a state in which the interval in the conical axicon system 87 is increased to a predetermined value (the focal length of the zoom lens 7 is invariable). The width of the secondary light source 130*b* in the radial direction (a value that is ½ the difference between the outer diameter and inner diameter, indicated by the double-headed arrows in the drawings) is the same as the width of the secondary light source 130*a* in the radial direction. When increasing the interval in the conical axicon system 87 from zero to a predetermined value, the outer diameter and inner diameter of the annular secondary light source can be increased from the standard state while maintaining the same radial width of the annular secondary light source as the standard state. That is, the conical axicon system 87 functions to vary the annular ratio (inner diameter/outer diameter) and size (outer diameter) of the secondary light source without changing the radial width of the annular secondary light source.

Figure 6:
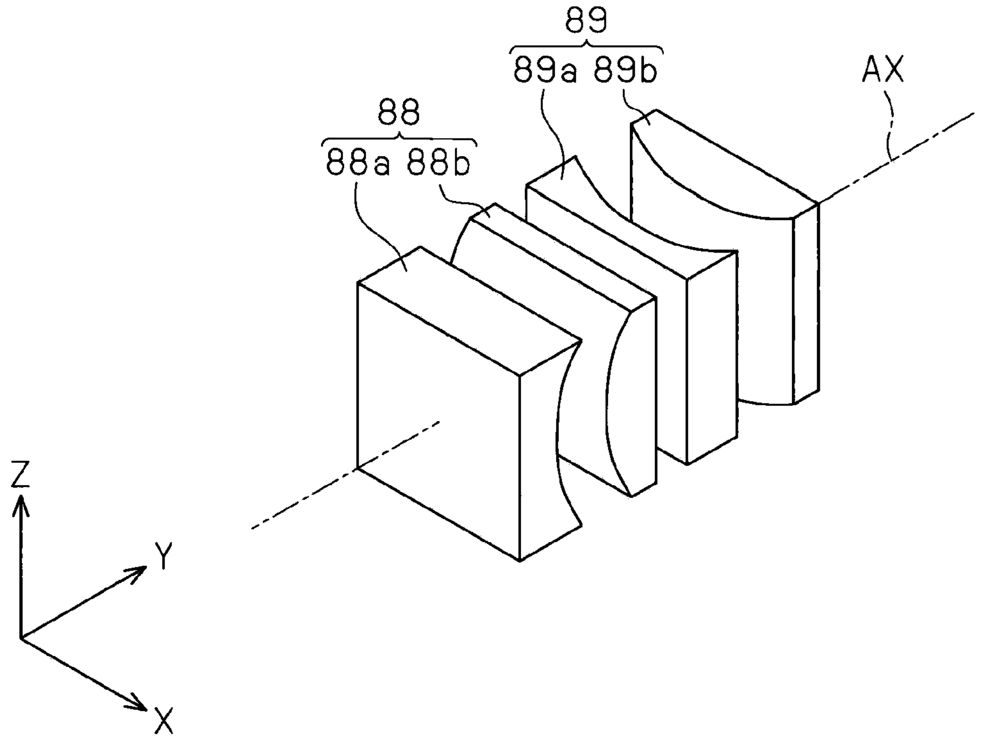
FIG. 6 is a schematic diagram showing a first cylindrical lens pair and a second cylindrical lens pair in the illumination optical system according to the embodiment.

FIG. 6 is a schematic diagram showing the first cylindrical lens pair 88 and the second cylindrical lens pair 89 arranged in an optical path between the front lens group 5*a* and rear lens group 5*b* of the afocal lens 5. As shown in FIG. 6, the first cylindrical lens pair 88 includes from the light source side a first cylindrical negative lens 88*a*, which has, for example, negative refractive power in a YZ plane and no refractive power in an XY plane, and a first cylindrical positive lens 88*b*, which has positive refraction power in a YZ plane and no refractive power in an XY plane. The second cylindrical lens pair 89 includes from the light source side a second cylindrical negative lens 89*a*, which has, for example, negative refractive power in an XY plane and no refractive power in a YZ plane, and a second cylindrical positive lens 89*b*, which has positive refraction power in an XY plane and no refractive power in a YZ plane.

The first cylindrical negative lens 88*a* and the first cylindrical positive lens 88*b* are formed so as to rotate integrally about the optical axis AX. In the same manner, the second cylindrical negative lens 89*a* and the second cylindrical positive lens 89*b* are formed so as to rotate integrally about the optical axis AX. The first cylindrical lens pair 88 functions as a beam expander having power in the Z direction, and the second cylindrical lens pair 89 functions as a beam expander having power in the X direction. Further, in the present embodiment, the first cylindrical lens pair 88 and the second cylindrical lens pair 89 are set to have the same power. Accordingly, the light that passes through the first cylindrical lens pair 88 and the second cylindrical lens pair 89 is subjected to a magnification effect resulting from the same powers in the Z direction and X direction.

The light that passes through the afocal lens 5 enters the zoom lens 7, which varies the c value. The predetermined plane 6 is located at or near the front focal point of the zoom lens 7, and the micro-lens array 10, which will be described later, is arranged at or near the rear focal plane of the zoom lens 7. Thus, the zoom lens 7 arranges the predetermined plane 6 and the incidence surface of the micro-lens array 10 to substantially satisfy an optical Fourier transform relationship and consequently arranges the pupil position of the afocal lens 5 and the incidence surface of the micro-lens array 10 to be generally conjugated with each other. Accordingly, in the same manner as the pupil position of the afocal lens 5, for example, an annular illumination field is formed about the optical axis AX on the incidence surface of the micro-lens array 10. The entire shape of the annular illumination field varies in similarity in a manner dependent on the focal length of the zoom lens 7. That is, the size of the secondary light source (planar light source) formed at a position optically conjugated to the pupil position of the illumination optical system by the micro-lens array 10 is varied in similarity in a manner dependent on the focal length of the zoom lens 7 while keeping the amount of the illumination light emitted from the laser light source 1 substantially constant.

Figure 7A:
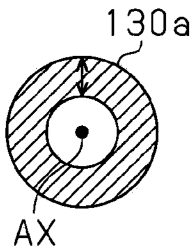
FIG. 7 is a diagram illustrating the operation of a zoom lens with respect to a secondary light source formed through the annular illumination according to the embodiment.
Figure 7B:
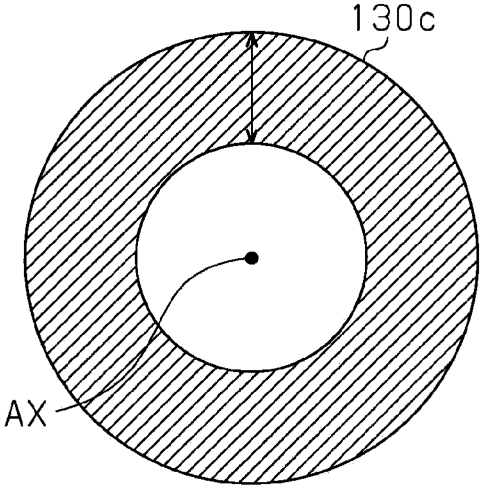

FIG. 7 includes drawings illustrating the operation of the zoom lens 7 with respect to the secondary light source formed by the annular illumination. FIG. 7(*a*) is a drawing showing the annular secondary light source 130*a* that is formed in the standard state, and FIG. 7(*b*) is a drawing showing an annular secondary light source 130*c* that is formed in a state in which the focal length of the zoom lens 7 is increased to a predetermined value (the interval of the conical axicon system 87 is invariable). Referring to FIGS. 7(*a*) and 7(*b*), when increasing the focal length of the zoom lens 7 from the minimum value to a predetermined value, the annular secondary light source 130*a* is transformed to the secondary light source 130*c* by magnifying the entire shape of the annular secondary light source 130*a* in similarity while keeping the amount of illumination light substantially constant. That is, the zoom lens 7 functions to vary the width and size (outer diameter) of the annular secondary light source without changing the annular ratio of the annular secondary light source. The light that passes through the zoom lens 7 enters a beam splitter 8. The light reflected by the beam splitter 8 enters a CCD imaging unit 9 (detection unit). The CCD imaging unit 9 sends an image signal to the control unit 20. The beam splitter 8, which is arranged in an optical path between the spatial light modulator and irradiated plane, is also referred to as an optical path branching member, which branches off some of the illumination light from the optical path and guides the branched light to an information acquisition unit.

The light that passes through the beam splitter 8 enters the micro-lens array 10, which serves as an optical integrator. The incidence angle of the light entering the micro-lens array 10 varies in accordance with changes in the interval in the conical axicon system 87 in the same manner as the angle of the light entering the predetermined plane 6. The micro-lens array 10 is an optical device formed by a matrix of a plurality of densely arranged micro lenses having positive refractive power. Each micro lens of the micro-lens array 10 includes a rectangular cross-section, which is in similarity with the shape of the illumination field that is to be formed on the mask M ( (i.e., a plane to be irradiated or an irradiated plane). (consequently, the shape of the exposure region that is to be formed on a wafer W). The light entering the micro-lens array 10 is divided two-dimensionally by the plurality of micro lens so as to form at a rear focal plane (consequently, an illumination pupil) a secondary light source having generally the same light distribution as the illumination field formed by the light entering micro-lens array 10, that is, a secondary light source, which is formed by a substantially annular planar light source extending about the optical axis AX.

Since in the present example the mask M located on an irradiated plane is illuminated by Kohler illumination, the plane on which this secondary light source is formed is a plane conjugate with an aperture stop of the projection optical system PL and can be called an illumination pupil plane of the illumination apparatus IL. Typically, the irradiated plane (the plane on which the mask M is arranged or the surface on which the wafer W is arranged) becomes an optical Fourier transform plane with respect to the illumination pupil plane. The pupil intensity distribution is a light intensity distribution on the illumination pupil plane of the illumination apparatus IL or on a plane conjugate with the illumination pupil plane. However, when the number of wavefront divisions by the micro-lens array 10 is large, an overall luminance distribution formed on the entrance surface of the micro-lens array 10 shows a high correlation with the overall intensity distribution of the entire secondary light source (pupil intensity distribution), and, therefore, the light intensity distributions on the entrance surface of the micro-lens array 10 and on a plane conjugate with the entrance surface can also be called pupil intensity distributions. Concerning such micro-lens array 10, reference can be made to U.S. Pat. No. 6,913,373, and U.S. Pat. Application No. 2008/0074631. U.S. Pat. No. 6,913,373, and U.S. Pat. Application No. 2008/0074631 are incorporated as reference herein. The micro-lens array 10 can be termed a micro fly's eye lens.

The light from the annular secondary light source formed on the rear focal plane of the micro-lens array 10 passes through an aperture stop 12, which can be arranged at or near the rear focal plane (emission plane) of the micro-lens array 10. The aperture stop 12 is formed, for example, by an iris stop or the like that limits the size of the secondary light source formed on the rear focal plane of the micro-lens array 10 to a predetermined size. The light beams that pass through the aperture stop 12 passes through a beam splitter 14 and a condenser lens 17$a$ and illuminates a mask blind MB in a superimposed manner. The light reflected by the beam splitter 14 passes through a lens 15 and enters a photodiode 16. The photodiode 16 sends a detection signal to the control unit 20. The beam splitter 14, which is arranged in the optical path between the spatial light modulator and irradiated plane, is also referred to as an optical path branching member, which branches off some of the illumination light from the optical path and guides the branched light to an information acquisition unit.

A rectangular illumination field, which is in accordance with the shape and focal length of each micro lens forming the micro-lens array 10, is formed in the mask blind MB, which serves as an illumination field stop. The light beams that pass through a rectangular aperture of the mask blind MB is subjected to a light converging operation of an imaging optical system 17$b$ and then reflected by a reflection mirror 19 to illuminate in a superimposing manner the mask M, on which a predetermined pattern is formed. That is, the imaging optical system 17$b$ forms an image of the rectangular aperture in the mask blind MB on the mask M, which is placed on a mask stage MS. The laser light source 1 to reflection mirror 19, the CCD imaging units 32 and 33, and the spatial light modulation unit SM1 form an illumination optical system.

The light that passes through the pattern on the mask M forms a pattern image of the mask M on the wafer W, which is a photosensitive substrate. In this manner, the pattern of the mask M is sequentially exposed onto each exposure region in the mask by performing batch exposure or scan exposure while two-dimensionally drive-controlling the wafer W on a wafer stage WS in a plane that is orthogonal to the optical axis AX of the projection optical system PL.

In the exposure apparatus of the present embodiment, the control unit 20 detects in predetermined time intervals the light intensity distribution (information related to light intensity distribution) at the pupil position of the illumination optical system or a position optically conjugated with the pupil position based on the detection signal from the CCD imaging unit 9. When the desired light intensity distribution is not formed at the pupil position of the illumination optical system or when variations (non-uniformity) in the light intensity is detected in the light distribution shape, the control unit 20 corrects the optimization calculation, which is performed by the control unit 20, for the inclination angle and inclination direction of each mirror element SE1 based on the detection results of the CCD imaging units 32 and 33. More specifically, based on the detection results of the CCD imaging units 32 and 33, the control unit 20 performs an optimization calculation so that the light intensity becomes uniform in the light distribution shape on the pupil plane of the illumination optical system. However, as time elapses, changes take place in the optical characteristics of the illumination optical system. This may result in the light intensity becoming non-uniform in the light distribution shape at the pupil position of the illumination optical system. Accordingly, the control unit 20 corrects the optimization calculation based on the detection result of the CCD imaging unit 9. Then, the control unit 20 adjusts the inclination angle and inclination direction of each mirror element SE1 through the corrected optimization calculation based on the detection results of the CCD imaging units 32 and 33. Based on the adjusted inclination angle and inclination direction, the control unit 20 controls the SLM drive unit 26 to control the inclination angle and inclination direction of each mirror element SE1 and form the desired light distribution shape at the pupil position of the illumination optical system or a position optically conjugated with the pupil position.

The exposure apparatus of the present embodiment shown in FIG. 1 is arranged separately from a movable exposure stage (wafer stage WS), which holds a processed substrate such as the wafer W. A CCD imaging unit 39 (detection unit) is arranged on a measurement stage, which supports various measurement members and sensors. Based on light that passes through both of the illumination optical system and the projection optical system, the CCD imaging unit 39 detects the light intensity distribution at the pupil position of the illumination optical system (projection optical system) and a position optically conjugated with the pupil position and sends the detection result to the control unit 20. The employment of the CCD imaging unit 39 enables correction of influences resulting from optical characteristic variations that occur as time elapses in the projection optical system in addition to the illumination optical system. Such a CCD imaging unit 39 is disclosed, for example, in U.S. Patent Application Publication No. 2008/0030707. An exposure apparatus including such a measurement stage is disclosed, for example, in Japanese Laid-Open Patent Publication No. 11-135400. The teachings of Japanese Laid-Open Patent Publication No. 11-135400 and U.S. Patent Application Publication No. 2008/0030707 are incorporated by reference.

The CCD imaging unit 9, together with one or both of the photodiode 16 and the CCD imaging unit 39 when necessary, may also be referred to as an information acquisition unit which acquires information related to the light intensity distribution.

In the exposure apparatus of the present embodiment, the inclination angle and inclination direction of each mirror element in the spatial light modulator, which obtains the desired light intensity distribution at the pupil position of the illumination optical system or a position optically conjugated with the pupil position, is adjusted by the optimization calculation based on the detection results of the CCD imaging units 32 and 33. Thus, in comparison with when detecting the light intensity distribution at the pupil position of the illumination optical system and calculating the optical inclination angle and inclination direction of each mirror element SE1 in the spatial light modulator S1 based on the detection result, the inclination angle and inclination direction of each mirror element SE1 can be obtained with less calculations. This enables the desired light intensity distribution to be easily formed at the pupil position of the illumination optical system or a position optically conjugated with the pupil position. Further, the light intensity distribution at the pupil position of the illumination optical system is detected at predetermined time intervals. Based on this detection result, the optimization calculation, which is based on the detection result of the CCD imaging units 32 and 33, is corrected. This ensures accurate optimization calculations that are based on the detection result of the CCD imaging units 32 and 33. Accordingly, mask patterns may be exposed into wafers with a high resolution and satisfactory throughput.

The above-described embodiment uses a single spatial light modulator. However, a plurality of spatial light modulators may be used. A modification using a plurality of spatial light modulators will now be described with reference to FIG. 8.

Figure 8:
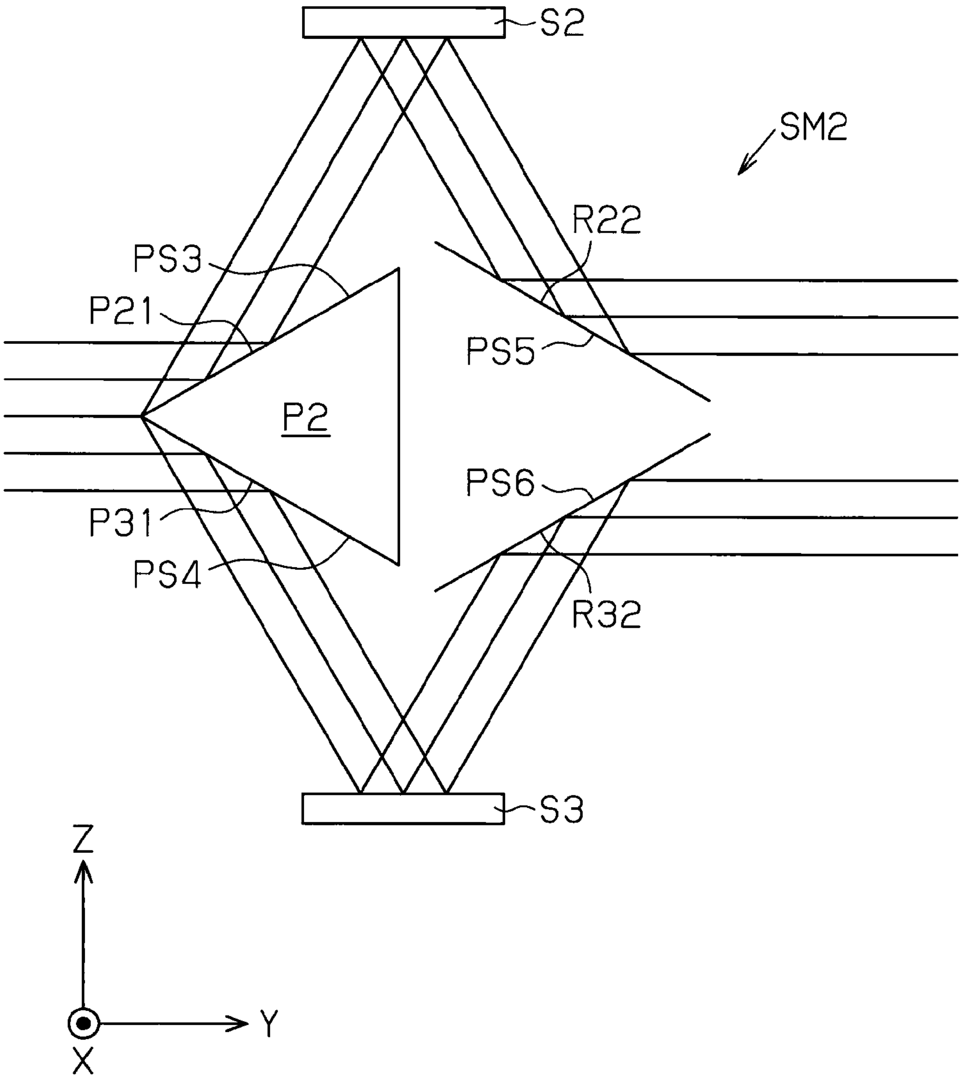
FIG. 8 is a diagram showing the structure of a further illumination optical system according to the embodiment.

FIG. 8 shows a spatial light modulation unit SM2 arranged at the position where the spatial light modulation unit SM1 shown in FIG. 1 is located, that is, in the optical path between the beam splitter 3 and the afocal lens 5. FIG. 8 shows only the optical path between the beam splitter 3 and the afocal lens 5.

The spatial light modulation unit SM2 includes a divisional light guide member, which divides the incident light into two lights (generally, a plurality of lights) and then guides the first light to a first spatial light modulator S2 and the second light to a second spatial light modulator S3.

In the modification of FIG. 8, a prism P2, which is shaped as a triangular prism having a triangular cross-section along a YZ plane, is used as the divisional light guide member. The prism P2 includes two side surfaces PS3 and PS4, which are symmetric to a plane lying along the optical axis and being parallel to a YZ plane. The side surface PS3 functions as a reflection surface R21 that reflects the incident light toward a plurality of mirror elements in the first spatial light modulator S2. The side surface PS4 functions as a reflection surface R31 that reflects the incident light toward a plurality of mirror elements in the second spatial light modulator S3. The prism P2 divides incident light into two lights along the ridgelines of the reflection surfaces R21 and R31.

In other words, the prism P2, which functions as the divisional light guide member, includes a first deflection surface R21, which deflects the incident light toward the first spatial light modulator S2, and a deflection surface R31, which deflects the incident light toward the second spatial light modulator S3. Further, the prism P2 divides the incident light into a first light and a second light along the ridgelines of the first deflection surface R21 and the second deflection surface R31. The light that reaches the first spatial light modulator S2 is reflected by a reflection surface R22 (third deflection surface) of a planar reflection mirror PS5 and emitted out of the spatial light modulation unit SM2. The light that reaches the second spatial light modulator S3 is reflected by a reflection surface R32 (fourth deflection surface) of a planar reflection mirror PS6 and emitted out of the spatial light modulation unit SM2.

The structures of the first and second spatial light modulators S2 and S3 are the same as the spatial light modulator S1 described above and thus will not be described here.

When using the divisional light guide member P2, which divides incident light into a plurality of lights and guides the divided lights to the spatial light modulators S2 and S3, when the light entering the divisional light guide member P2 is displaced, the illuminance ratio of the light guided to the spatial light modulators S2 and S3 changes. As a result, the light intensity distribution formed at the pupil position of the illumination optical system may not be desirable. However, in this modification, the detection unit (30 to 33) detects displacement of the light entering the divisional light guide member P2 and corrects light intensity distribution errors, which are caused by the light displacement, in the light distribution shape formed at the pupil position of the illumination optical system by correcting the inclination angle and inclination direction of each mirror element in the spatial light modulators S2 and S3.

In the exposure apparatus of the above-described embodiment, a spatial light modulator that enables the orientation of two-dimensionally arranged reflection surfaces to be separately controlled is used as the spatial light modulator including a plurality of two-dimensionally arranged, separately controlled reflection elements. Examples of such a spatial light modulator are disclosed in Japanese National Phase Laid-Open Patent Publication No. 10-503300 and its corresponding European Patent Publication No. 779530, Japanese Laid-Open Patent Publication No. 2004-78136 and its corresponding U.S. Pat. No. 6,900,915, Japanese National Phase Laid-Open Patent Publication No. 2006-524349 and its corresponding U.S. Pat. No. 7,095,546, and Japanese Laid-Open Patent Publication No. 2006-113437. In these spatial light modulators, light that has passed through each reflection surface of the spatial light modulator enters a distribution formation optical system at a predetermined angle and forms a predetermined light intensity distribution on an illumination pupil plane in correspondence with a control signal sent to the plurality of optical elements. The teachings of European Patent Publication No. 779530, U.S. Pat. Nos. 6,900,915, and 7,095,546 are incorporated by reference.

Further, as the spatial light modulator, for example, a spatial light modulator enabling the height of two-dimensionally arranged reflection surfaces to be separately controlled may be used. Examples of such a spatial light modulator are disclosed in Japanese Laid-Open Patent Publication No. 6-281869 and its corresponding U.S. Pat. No. 5,312,513 and Japanese National Phase Laid-Open Patent Publication No. 2004-520618 and its corresponding U.S. Pat. No. 6,885,493 in FIG. 1d. In these spatial light modulators, the formation of a two-dimensional height distribution affects incident light in the same manner as a diffraction plane. The teachings of U.S. Pat. Nos. 5,312,513 and 6,885,493 are incorporated by reference.

The above-described spatial light modulator including a plurality of two-dimensionally arranged reflection surfaces may be modified in accordance with the disclosures of, for example, Japanese National Phase Laid-Open Patent Publication No. 2006-513442 and its corresponding U.S. Pat. No. 6,891,655 and Japanese National Phase Laid-Open Patent Publication No. 2005-524112 and its corresponding U.S. Patent Application Publication No. 2005/0095749. The teachings of U.S. Pat. No. 6,891,655 and U.S. Patent Application Publication No. 2005/0095749 are incorporated by reference.

In the exposure apparatus of the above-described embodiment, an ArF excimer laser light source or a KrF excimer laser light source is used. However, an $F_2$ laser light source may be used instead.

In the exposure apparatus of the above-described embodiment and modification, the spatial light modulator may be controlled as described below.

A case in which the control is executed to form a specific light intensity distribution (hereafter, referred to as the first pupil intensity distribution) at the pupil position of the illumination optical system or a position optically conjugated with the pupil position will be discussed. Prior to actual exposure, the correction procedures described below are performed.

First, the first CCD imaging unit 32 and second CCD imaging unit 33, which serve as a detection unit, are used to measure the incidence angle of the light directed toward the spatial light modulator S1 (S2 and S3) and the illuminance distribution in the cross-section of the light. Then, the detection unit sends the measurement result to the control unit 20.

Based on information of the inclination angle and inclination direction of each mirror element in the spatial light modulator S1 that is read from the storage unit 22 to generate the first pupil intensity distribution and correction information of the inclination angle and inclination direction of each mirror element SE1 that can be calculated from the measurement result of the detection unit, the control unit 20 sends a control signal to the SLM drive unit 26. The SLM drive unit 26 sets the inclination angle and inclination direction of each mirror element based on the control signal from the SLM drive unit 26.

After the setting, the CCD imaging unit 39 measures the light intensity distribution at a position conjugated with the pupil position of the projection optical system and sends the measurement results to the control unit 20. At the same time, the CCD imaging unit 9 measures the light intensity distribution formed on the incidence surface of the optical integrator 10 and sends the measurement result to the control unit 20. During the measurement, the imaging unit 39 uses as the mask M a light transmissive substrate having no pattern.

The control unit 20 compares the light intensity distribution measured by the imaging unit 39 and the first pupil intensity distribution that is to be formed. When the intensity distributions are the same (the difference therebetween being within a tolerable range), the measurement result of the CCD imaging unit 9 is stored in the storage unit 22 in association with the first pupil intensity distribution. When the intensity distributions are not the same (the difference therebetween being outside the tolerable range), the control unit 20 performs the procedures for resetting the inclination angle and inclination direction of each mirror element S1 in the spatial light modulator S1, and the CCD imaging unit 39 repeats the measurement procedures.

In addition to the first pupil intensity distribution, when there are other types of pupil intensity distribution used for actual exposure, the correction procedures are performed for each of the pupil intensity distributions (e.g., second pupil intensity distribution and third pupil intensity distribution).

During the actual exposure, the first and second CCD imaging units 32 and 33 measure the incidence angle of the light entering the SLM and the illuminance distribution in the cross-section of the light just before exposing a single lot of wafers. Based on the measurement result, the control unit 20 sets the inclination angle and inclination direction of each mirror element SE1 in the spatial light modulator S1 with the SLM drive unit 26. In this state, the CCD imaging unit 9 measures the light intensity distribution in the cross-section of the light that enters the optical integrator 10. The measurement result is compared with the measurement result associated with the first pupil intensity distribution stored in the storage unit 22. When the measurement results are the same (the difference therebetween being within the tolerable range), exposure is actually performed. When the measurement results are not the same (the difference therebetween being outside the tolerable range), the inclination angle and inclination direction of the mirror elements SE1 in the spatial light modulator S1 are adjusted with the SLM drive unit 26.

In these procedures, measurements are taken with the CCD imaging unit 9, which is always capable of performing measurements. Thus, the throughput is not decreased. When performing measurements with the CCD imaging unit 39, the CCD imaging unit 39 must be located at the light emission side of the projection optical system. Thus, during a measurement, the wafer stage cannot be moved to the light emission side of the projection optical system. This decreases throughput during the measurement.

Figure 9:
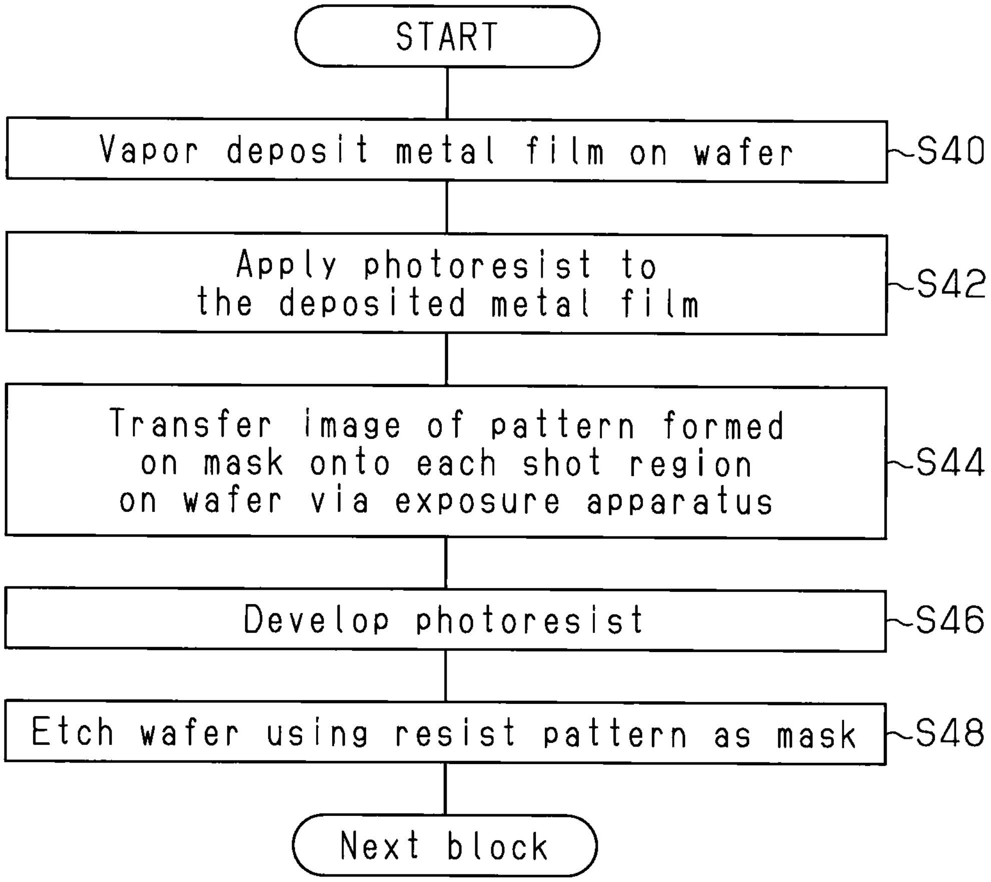
FIG. 9 is a flowchart illustrating a method for manufacturing a semiconductor device, which serves as a micro-device, according to the embodiment.

A method for manufacturing a device serving using the exposure apparatus of the above-described embodiment will now be discussed with reference to the flowchart of FIG. 9. As shown in the flowchart, in a semiconductor manufacturing block, a metal film is vapor-deposited onto a wafer W, which becomes a substrate for a semiconductor device (S40), and photoresist, which is a photosensitive material, is applied to the metal film (S42). Then, a pattern formed on a reticle (mask) is transferred onto each shot region in the wafer W with the exposure apparatus of the embodiment (S44: exposure block). The wafer W that has undergone the transfer is developed, that is, the photoresist on which the pattern has been transferred is developed (S46: development block). Subsequently, a resist pattern formed on a surface of the wafer W is used as a mask to perform processing such as etching on the surface of the wafer W (S48: processing block).

The resist pattern is a photoresist layer including recesses and projections having shapes corresponding to the pattern transferred by the exposure apparatus of the embodiment. The recesses extend through the photoresist layer. In block S48, the surface of the wafer W is processed through the resist pattern. The processing performed on the surface of the wafer W in block S48 includes, for example, at least either one of etching and metal film formation. In block S44, the exposure apparatus of the embodiment uses the wafer W to which photoresist is applied as a photosensitive substrate, or plate P, to transfer the pattern.

Figure 10:
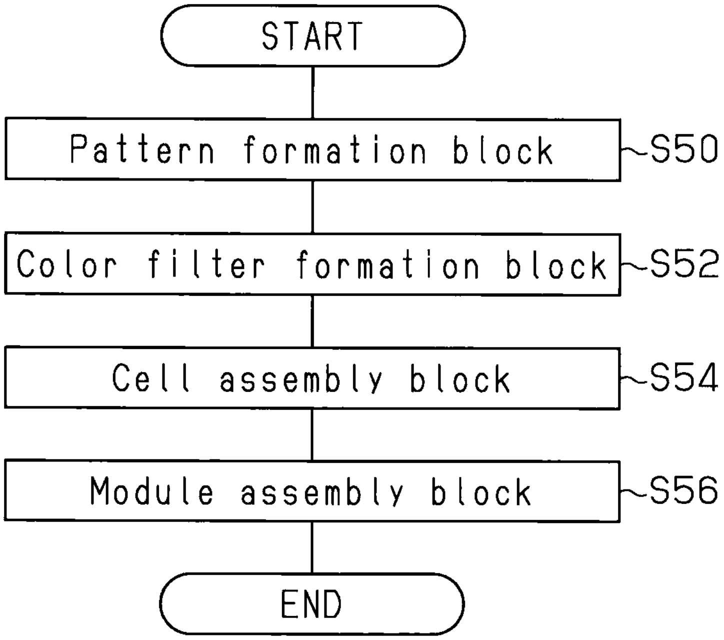
FIG. 10 is a flowchart illustrating a method for manufacturing a liquid crystal display device, which serves as a micro-device, according to the embodiment.

FIG. 10 is a flowchart showing the manufacturing of a liquid crystal device such as a liquid crystal display device. As shown in the flowchart, to manufacture a liquid crystal device, a pattern formation block (S50), a color filter formation block (S52), a cell assembly block (S54), and a module assembly block (S56) are sequentially performed.

In the pattern formation block of block S50, the exposure apparatus of the embodiment forms a predetermined pattern such as a circuit pattern and an electrode pattern on the plate P, which is a glass substrate to which the photoresist is applied (or the wafer W to which the photoresist is applied). The pattern formation block includes an exposure block for transferring a pattern onto a photoresist layer with the exposure apparatus of the embodiment, a development block for developing the plate P onto which the pattern has been transferred, that is, for developing the photoresist layer on the glass substrate, and a processing block for processing the surface of the glass substrate through the developed photoresist layer.

In the color filter formation block of S52, a color filter is formed in which a plurality of sets of three dots corresponding to R (Red), G (Green), and B (Blue) are arranged in a matrix or in which a plurality of sets of three stripe filters of R, G, and B are arranged extending in a horizontal scanning line direction.

In the cell assembling block of S54, a liquid crystal panel (liquid crystal cell) is assembled using the glass substrate having the predetermined pattern obtained in block S50 and the color filter obtained in block S52. More specifically, a liquid crystal panel is manufactured by injecting liquid crystal between the glass substrate and the color filter.

In a module assembling block of S56, components such as electric circuits and a backlight for enabling a display operation of the assembled liquid crystal panel are mounted on the liquid crystal panel.

The application of the present invention is not limited to an exposure apparatus for manufacturing a semiconductor device. The present invention may also be applied to exposure apparatuses for a liquid crystal display device formed on a rectangular glass plate or for a display device such as a plasma display device. The present invention may also be widely applied to exposure apparatuses that manufacture various types of devices, such as an imaging device (CCD and the like), a micro-machine, a thin-film magnetic head, and a DNA chip. Further, the present invention may be applied to an exposure process (exposure apparatus) used when manufacturing various types of devices to form a mask (photomask, reticle, etc.) including a mask pattern during lithography.

As the above-described CCD imaging unit, for example, an imaging unit with a CMOS image sensor, a photodiode array, or a camera tube may be used.

In the foregoing embodiments, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filing the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. International Publication WO99/49504, Japanese Patent Application Laid-open No. 6-124873, and Japanese Patent Application Laid-open No. 10-303114 are incorporated as references herein.

In the foregoing embodiment, it is also possible to apply the so-called polarized illumination method disclosed in U.S Pat. Published Application Nos. 2006/0203214, 2006/0170901, and 2007/0146676. Teachings of the U.S Pat. Published Application Nos. 2006/0203214, 2006/0170901, and 2007/0146676 are incorporated herein by reference.

The invention is not limited to the fore going embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical system which illuminates an irradiated plane with illumination light provided from a light source, the illumination optical system comprising:

a spatial light modulator which is arranged in an optical path of the illumination optical system and cooperates with part of the illumination optical system to form a desired light intensity distribution at a pupil position of the illumination optical system or a position optically conjugated with the pupil position;

a detection unit which detects the light intensity distribution of the illumination light at a position in an optical path extending from the light source to the spatial light modulator, with the detection unit including a light receiving surface which receives some of the illumination light;

a control unit which controls the spatial light modulator based on the light intensity distribution detected by the detection unit;

an information acquisition unit which acquires information on the light intensity distribution at the pupil position of the illumination optical system or the position optically conjugated with the pupil position; and an optical path branching member which is arranged in an optical path between the spatial light modulator and the irradiated plane, with the optical path branching member branching off some of the illumination light from the optical path and guiding the branched off light to the information acquisition unit, wherein the control unit corrects the controlling executed by the control unit based on the light intensity distribution at the pupil position of the illumination optical system or the position optically conjugated with the pupil position that is acquired by the information acquisition unit.

2. The illumination optical system according to claim 1, wherein:

the illumination light includes a plurality of light pulses;

the light receiving surface of the detection unit receives the light intensity distribution of the illumination light formed based on the light pulses, every one or more light pulses; and the control unit controls the spatial light modulator based on a plurality of the light intensity distributions of the illumination light detected for every one or more light pulses.

3. The illumination optical system according to claim 1, wherein the information acquisition unit acquires information on the light intensity distribution at the pupil position of the illumination optical system or the position optically conjugated with the pupil position based on the illumination light that has passed through the irradiated plane.

4. The illumination optical system according to claim 1, wherein the spatial light modulator includes:

a first spatial light modulator which cooperates with the part of the illumination optical system to form a first light intensity distribution at the pupil position of the illumination optical system or the position optically conjugated with the pupil position; and a second spatial light modulator which cooperates with the part of the illumination optical system to form a second light intensity distribution at the pupil position of the illumination optical system or the position optically conjugated with the pupil position.

5. The illumination optical system according to claim 4, further comprising:

a divisional light guide member which is arranged in an optical path between the light source and the spatial light modulator, with the divisional light guide member dividing the illumination light from the light source and guiding the divided light to the first and second spatial light modulators.

6. The illumination optical system according to claim 5, wherein the detection unit detects the light intensity distribution of the illumination light at a position in an optical path extending from the light source to the divisional light guide member.

7. The illumination optical system according to claim 1, wherein:

the detection unit detects a position on the light receiving surface at which the illumination light falls; and the control unit controls the spatial light modulator based on the position on the light receiving surface at which the illumination light falls.

8. The illumination optical system according to claim 7, wherein:

the detection unit includes an incidence angle detection unit which detects incidence angle of the illumination light entering the spatial light modulator; and the control unit controls the spatial light modulator based on the incidence angle detected by the incidence angle detection unit.

9. The illumination optical system according to claim 8, wherein:

the spatial light modulator includes a plurality of two-dimensionally arranged elements; and the plurality of two-dimensionally arranged elements are controllable independently from each other to perform spatial optical modulation on incident light before emitting the light.

10. The illumination optical system according to claim 1, wherein the spatial light modulator includes:

a first spatial light modulator which cooperates with the part of the illumination optical system to form a first light intensity distribution at the pupil position of the illumination optical system or the position optically conjugated with the pupil position; and a second spatial light modulator which cooperates with the part of the illumination optical system to form a second light intensity distribution at the pupil position of the illumination optical system or the position optically conjugated with the pupil position.

11. The illumination optical system according to claim 10, further comprising:

a divisional light guide member which is arranged in an optical path between the light source and the spatial light modulator, with the divisional light guide member dividing the illumination light from the light source and guiding the divided light to the first and second spatial light modulators.

12. The illumination optical system according to claim 11, wherein the detection unit detects the light intensity distribution of the illumination light at a position in an optical path extending from the light source to the divisional light guide member.

13. The illumination optical system according to claim 1, wherein:

the detection unit detects a position on the light receiving surface at which the illumination light falls; and the control unit controls the spatial light modulator based on the position on the light receiving surface at which the illumination light falls.

14. The illumination optical system according to claim 13, wherein:

the detection unit includes an incidence angle detection unit which detects incidence angle of the illumination light entering the spatial light modulator; and the control unit controls the spatial light modulator based on the incidence angle detected by the incidence angle detection unit.

15. The illumination optical system according to claim 1, wherein:

the detection unit includes an incidence angle detection unit which detects incidence angle of the illumination light entering the spatial light modulator; and the control unit controls the spatial light modulator based on the incidence angle detected by the incidence angle detection unit.

16. The illumination optical system according to claim 1, wherein:

the spatial light modulator includes a plurality of two-dimensionally arranged elements; and the plurality of two-dimensionally arranged elements are controllable independently from each other to perform spatial optical modulation on incident light before emitting the light.

17. The illumination optical system according to claim 16, wherein:

the plurality of elements each include a reflection surface; and the reflection surfaces of the plurality of elements are controllable independently from each other to perform spatial optical modulation on incident light before emitting the light.

18. The illumination optical system according to claim 17, wherein orientations of the reflection surfaces are controllable independently from each other.

19. An exposure apparatus which transfers a predetermined pattern onto a photosensitive substrate, the exposure apparatus comprising:

the illumination optical system according to claim 1 which illuminates the pattern that is arranged on an irradiated plane.

20. The illumination optical system according to claim 1, further comprising:

an information acquisition unit which acquires information on the light intensity distribution at the pupil position of the illumination optical system or the position optically conjugated with the pupil position; and wherein the control unit corrects the controlling executed by the control unit based on the light intensity distribution at the pupil position of the illumination optical system or the position optically conjugated with the pupil position that is acquired by the information acquisition unit.

21. An illumination optical system which illuminates an irradiated plane with illumination light provided from a light source, the illumination optical system comprising:

a spatial light modulator which is arranged in an optical path of the illumination optical system and cooperates with part of the illumination optical system to form a desired light intensity distribution at a pupil position of the illumination optical system or a position optically conjugated with the pupil position;

a detection unit which detects the light intensity distribution of the illumination light at a position in an optical path extending from the light source to the spatial light modulator, with the detection unit including a light receiving surface which receives some of the illumination light;

a control unit which controls the spatial light modulator based on the light intensity distribution detected by the detection unit; and an information acquisition unit which acquires information on the light intensity distribution at the pupil position of the illumination optical system or the position optically conjugated with the pupil position;

wherein the control unit corrects the controlling executed by the control unit based on the light intensity distribution at the pupil position of the illumination optical system or the position optically conjugated with the pupil position that is acquired by the information acquisition unit, wherein the detection unit detects a position on the light receiving surface at which the illumination light falls;

wherein the control unit controls the spatial light modulator based on the position on the light receiving surface at which the illumination light falls, wherein the detection unit includes an incidence angle detection unit which detects incidence angle of the illumination light entering the spatial light modulator; and wherein the control unit controls the spatial light modulator based on the incidence angle detected by the incidence angle detection unit.

22. The illumination optical system according to claim 21, wherein:

the spatial light modulator includes a plurality of two-dimensionally arranged elements; and the plurality of two-dimensionally arranged elements are controllable independently from each other to perform spatial optical modulation on incident light before emitting the light.

23. The illumination optical system according to claim 21, wherein the spatial light modulator includes:

a first spatial light modulator which cooperates with the part of the illumination optical system to form a first light intensity distribution at the pupil position of the illumination optical system or the position optically conjugated with the pupil position; and a second spatial light modulator which cooperates with the part of the illumination optical system to form a second light intensity distribution at the pupil position of the illumination optical system or the position optically conjugated with the pupil position.

24. The illumination optical system according to claim 23, further comprising:

a divisional light guide member which is arranged in an optical path between the light source and the spatial light modulator, with the divisional light guide member dividing the illumination light from the light source and guiding the divided light to the first and second spatial light modulators.

25. The illumination optical system according to claim 24, wherein the detection unit detects the light intensity distribution of the illumination light at a position in an optical path extending from the light source to the divisional light guide member.

26. The illumination optical system according to claim 21, wherein:

the detection unit detects a position on the light receiving surface at which the illumination light falls; and the control unit controls the spatial light modulator based on the position on the light receiving surface at which the illumination light falls.

27. The illumination optical system according to claim 26, wherein:

the detection unit includes an incidence angle detection unit which detects incidence angle of the illumination light entering the spatial light modulator; and the control unit controls the spatial light modulator based on the incidence angle detected by the incidence angle detection unit.

28. The illumination optical system according to claim 21, wherein:

the detection unit includes an incidence angle detection unit which detects incidence angle of the illumination light entering the spatial light modulator; and the control unit controls the spatial light modulator based on the incidence angle detected by the incidence angle detection unit.

29. The illumination optical system according to claim 21, wherein:

the spatial light modulator includes a plurality of two-dimensionally arranged elements; and the plurality of two-dimensionally arranged elements are controllable independently from each other to perform spatial optical modulation on incident light before emitting the light.

30. The illumination optical system according to claim 29, wherein:

the plurality of elements each include a reflection surface; and the reflection surfaces of the plurality of elements are controllable independently from each other to perform spatial optical modulation on incident light before emitting the light.

31. The illumination optical system according to claim 27, wherein orientations of the reflection surfaces are controllable independently from each other.

32. An exposure apparatus which transfers a predetermined pattern onto a photosensitive substrate, the exposure apparatus comprising:

the illumination optical system according to claim 18 which illuminates the pattern that is arranged on an irradiated plane.

33. An illumination optical system which illuminates an irradiated plane with illumination light provided from a light source, the illumination optical system comprising:

a spatial light modulator tor which is arranged in an optical path of the illumination optical system and cooperates with part of the illumination optical system to form a desired light intensity distribution at a pupil position of the illumination optical system or a position optically conjugated with the pupil position;

a detection unit which detects the light intensity distribution of the illumination light at a position in an optical path extending from the light source to the spatial light modulator, with the detection unit including a light receiving surface which receives some of the illumination light; and a control unit which controls the spatial light modulator based on the light intensity distribution detected by the detection unit, wherein the detection unit includes an incidence angle detection unit which detects incidence angle of the illumination light entering the spatial light modulator, wherein the control unit controls the spatial light modulator based on the incidence angle detected by the incidence angle detection unit.

34. The illumination optical system according to claim 30, wherein:

the detection unit detects a position on the light receiving surface at which the illumination light falls; and the control unit controls the spatial light modulator based on the position on the light receiving surface at which the illumination light falls.

35. The illumination optical system according to claim 33, wherein:

the spatial light modulator includes a plurality of two-dimensionally arranged elements; and the plurality of two-dimensionally arranged elements are controllable independently from each other to perform spatial optical modulation on incident light before emitting the light.

36. The illumination optical system according to claim 32, wherein:

the plurality of elements each include a reflection surface; and the reflection surfaces of the plurality of elements are controllable independently from each other to perform spatial optical modulation on incident light before emitting the light.

37. The illumination optical system according to claim 33, wherein orientations of the reflection surfaces are controllable independently from each other.

38. An exposure apparatus which transfers a predetermined pattern onto a photosensitive substrate, the exposure apparatus comprising:

the illumination optical system according to claim 30 which illuminates the pattern that is arranged on an irradiated plane.

39. An exposure apparatus which transfers a predetermined pattern onto a photosensitive substrate, the exposure apparatus comprising:

an illumination optical system which illuminates an irradiated plane with illumination light provided from a light source, the illumination optical system comprising:

a spatial light modulator which is arranged in an optical path of the illumination optical system and cooperates with part of the illumination optical system to form a desired light intensity distribution at a pupil position of the illumination optical system or a position optically conjugated with the pupil position;

a detection unit which detects the light intensity distribution of the illumination light at a position in an optical path extending from the light source to the spatial light modulator, with the detection unit including a light receiving surface which receives some of the illumination light; and a control unit which controls the spatial light modulator based on the light intensity distribution detected by the detection unit.

40. The exposure apparatus according to claim 39, wherein:

the illumination light includes a plurality of light pulses;

the light receiving surface of the detection unit receives the light intensity distribution of the illumination light formed based on the light pulses, every one or more light pulses; and the control unit controls the spatial light modulator based on a plurality of the light intensity distributions of the illumination light detected for every one or more light pulses.

41. The exposure apparatus according to claim 39, further comprising:

an information acquisition unit which acquires information on the light intensity distribution at the pupil position of the illumination optical system or the position optically conjugated with the pupil position; and wherein the control unit corrects the controlling executed by the control unit based on the light intensity distribution at the pupil position of the illumination optical system or the position optically conjugated with the pupil position that is acquired by the information acquisition unit.

42. The exposure apparatus according to claim 41, further comprising:

an optical path branching member which is arranged in an optical path between the spatial light modulator and the irradiated plane, with the optical path branching member branching off some of the illumination light from the optical path and guiding the branched off light to the information acquisition unit.

43. The exposure apparatus according to claim 41, wherein the information acquisition unit acquires information on the light intensity distribution at the pupil position of the illumination optical system or the position optically conjugated with the pupil position based on the illumination light that has passed through the irradiated plane.

44. The exposure apparatus according to claim 41, wherein the spatial light modulator includes:

a first spatial light modulator which cooperates with the part of the illumination optical system to form a first light intensity distribution at the pupil position of the illumination optical system or the position optically conjugated with the pupil position; and a second spatial light modulator which cooperates with the part of the illumination optical system to form a second light intensity distribution at the pupil position of the illumination optical system or the position optically conjugated with the pupil position.

45. The exposure apparatus according to claim 44, further comprising:

a divisional light guide member which is arranged in an optical path between the light source and the spatial light modulator, with the divisional light guide member dividing the illumination light from the light source and guiding the divided light to the first and second spatial light modulators.

46. The exposure apparatus according to claim 45, wherein the detection unit detects the light intensity distribution of the illumination light at a position in an optical path extending from the light source to the divisional light guide member.

47. The exposure apparatus according to claim 41, wherein:

the detection unit detects a position on the light receiving surface at which the illumination light falls; and the control unit controls the spatial light modulator based on the position on the light receiving surface at which the illumination light falls.

48. The exposure apparatus according to claim 47, wherein:

the detection unit includes an incidence angle detection unit which detects incidence angle of the illumination light entering the spatial light modulator; and the control unit controls the spatial light modulator based on the incidence angle detected by the incidence angle detection unit.

49. The exposure apparatus according to claim 48, wherein:

the spatial light modulator includes a plurality of two-dimensionally arranged elements; and the plurality of two-dimensionally arranged elements are controllable independently from each other to perform spatial optical modulation on incident light before emitting the light.

50. The exposure apparatus according to claim 39, wherein the spatial light modulator includes:

a first spatial light modulator which cooperates with the part of the illumination optical system to form a first light intensity distribution at the pupil position of the illumination optical system or the position optically conjugated with the pupil position; and a second spatial light modulator which cooperates with the part of the illumination optical system to form a second light intensity distribution at the pupil position of the illumination optical system or the position optically conjugated with the pupil position.

51. The exposure apparatus according to claim 50, further comprising:

a divisional light guide member which is arranged in an optical path between the light source and the spatial light modulator, with the divisional light guide member dividing the illumination light from the light source and guiding the divided light to the first and second spatial light modulators.

52. The exposure apparatus according to claim 51, wherein the detection unit detects the light intensity distribution of the illumination light at a position in an optical path extending from the light source to the divisional light guide member.

53. The exposure apparatus according to claim 39, wherein:

the detection unit detects a position on the light receiving surface at which the illumination light falls; and the control unit controls the spatial light modulator based on the position on the light receiving surface at which the illumination light falls.

54. The exposure apparatus according to claim 53, wherein:

the detection unit includes an incidence angle detection unit which detects incidence angle of the illumination light entering the spatial light modulator; and the control unit controls the spatial light modulator based on the incidence angle detected by the incidence angle detection unit.

55. The exposure apparatus according to claim 39, wherein:

the detection unit includes an incidence angle detection unit which detects incidence angle of the illumination light entering the spatial light modulator; and the control unit controls the spatial light modulator based on the incidence angle detected by the incidence angle detection unit.

56. The exposure apparatus according to claim 39, wherein:

the spatial light modulator includes a plurality of two-dimensionally arranged elements; and the plurality of two-dimensionally arranged elements are controllable independently from each other to perform spatial optical modulation on incident light before emitting the light.

57. The exposure apparatus according to claim 56, wherein:

the plurality of elements each include a reflection surface; and the reflection surfaces of the plurality of elements are controllable independently from each other to perform spatial optical modulation on incident light before emitting the light.

58. The exposure apparatus according to claim 57, wherein orientations of the reflection surfaces are controllable independently from each other.

59. An illumination optical system which illuminates an irradiated plane with illumination light provided from a light source and is used in an exposure apparatus which transfers a predetermined pattern onto a photosensitive substrate, the illumination optical system comprising:

a spatial light modulator which is arranged in an optical path of the illumination optical system and cooperates with part of the illumination optical system to form a desired light intensity distribution at a pupil position of the illumination optical system or a position optically conjugated with the pupil position;

a detection unit which detects the light intensity distribution of the illumination light at a position in an optical path extending from the light source to the spatial light modulator, with the detection unit including a light receiving surface which receives some of the illumination light; and a control unit which controls the spatial light modulator based on the light intensity distribution detected by the detection unit.

* * * * *